US007561458B2

(12) United States Patent
Madan

(10) Patent No.: US 7,561,458 B2
(45) Date of Patent: Jul. 14, 2009

(54) FERROELECTRIC MEMORY ARRAY FOR IMPLEMENTING A ZERO CANCELLATION SCHEME TO REDUCE PLATELINE VOLTAGE IN FERROELECTRIC MEMORY

(75) Inventor: Sudhir Kumar Madan, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 153 days.

(21) Appl. No.: 11/756,466

(22) Filed: May 31, 2007

(65) Prior Publication Data

US 2008/0151598 A1    Jun. 26, 2008

Related U.S. Application Data

(60) Provisional application No. 60/877,203, filed on Dec. 26, 2006.

(51) Int. Cl.
G11C 11/34    (2006.01)
(52) U.S. Cl. ......................... 365/145; 365/158
(58) Field of Classification Search ................. 365/145, 365/158
See application file for complete search history.

(56) References Cited

U.S. PATENT DOCUMENTS

| 2,884,618 | A | * | 4/1959 | Epstein | 365/145 |
|---|---|---|---|---|---|
| 2,955,281 | A | * | 10/1960 | Brennemann et al. | 365/145 |
| 3,105,225 | A | * | 9/1963 | Williams et al. | 365/145 |
| 3,132,326 | A | * | 5/1964 | Crownover | 365/145 |
| 3,651,494 | A | * | 3/1972 | Lynch et al. | 365/145 |
| 6,046,928 | A | | 4/2000 | Takata | |
| 6,208,550 | B1 | | 3/2001 | Kim | |
| 6,487,103 | B2 | | 11/2002 | Yamamoto et al. | |
| 6,493,251 | B2 | | 12/2002 | Hoya et al. | |
| 6,510,073 | B1 | | 1/2003 | Lee et al. | |
| 6,661,697 | B2 | | 12/2003 | Yamamoto et al. | |
| 6,667,896 | B2 | | 12/2003 | Rickes et al. | |
| 6,710,385 | B2 | | 3/2004 | Takashima | |
| 6,906,945 | B2 | | 6/2005 | Madan | |
| 6,970,371 | B1 | | 11/2005 | Summerfelt et al. | |
| 7,009,864 | B2 | | 3/2006 | Madan | |
| 7,133,304 | B2 | | 11/2006 | Madan et al. | |
| 7,193,880 | B2 | | 3/2007 | Madan et al. | |
| 2003/0031042 | A1 | | 2/2003 | Yamamoto et al. | |
| 2003/0103372 | A1 | | 6/2003 | Matsushita | |
| 2003/0174532 | A1 | | 9/2003 | Matsushita et al. | |
| 2003/0206430 | A1 | | 11/2003 | Ho | |

OTHER PUBLICATIONS

U.S. Appl. No. 10/717,146, filed Nov. 18, 2003, Madan.
U.S. Appl. No. 10/805,809, filed Mar. 22, 2004, Madan et al.

(Continued)

Primary Examiner—Michael T Tran
(74) Attorney, Agent, or Firm—Rose Alyssa Keagy; Wade J. Brady, III; Frederick J. Telecky, Jr.

(57) ABSTRACT

Memory devices are provided, having a ferroelectric memory array and a zero cancellation system with one or more zero cancellation circuits for coupling a negative charge to a memory array bitline through a zero cancellation capacitor while a memory cell plateline signal is applied during a read operation, wherein one or more layers of the zero cancellation system layout is identical or substantially identical to that of the memory cells of the array.

29 Claims, 17 Drawing Sheets

OTHER PUBLICATIONS

U.S. Appl. No. 10/847,412, filed May 17, 2004, Summerfelt et al.
U.S. Appl. No. 10/866,834, filed Jun. 14, 2004, Madan et al.
Hoya, Katsuhiko et al., "A 64Mb Chain FeRAM with Quad-BL Architecture and 200MB/s Burst Mode," 2006 IEEE International Solid-State Circuits Conference, Session 7—Non-Volatile Memory 7.2, Feb. 6, 2006, p. 1-8.
"A Bit-Line GND Sense Technique for Low-Voltage Operation FeRAM", Shoichiro Kawashima, Toru Endo, Akira Yamamoto, Ken'Ichi Nakabayashi, Mitsuharu Nakazawa, Keizo Morita and Masaki Aoki, 2001 Symposium on VLSI Circuits Digest of Technical Papers, pp. 127 & 128.
"A Survey of Circuit Innovations in Ferroelectric Random-Access Memories", Ali Sheikholeslami and P. Glenn Gulak, Proceedings of the IEEE, vol. 88, No. 5, May 2000, pp. 667-689.

* cited by examiner

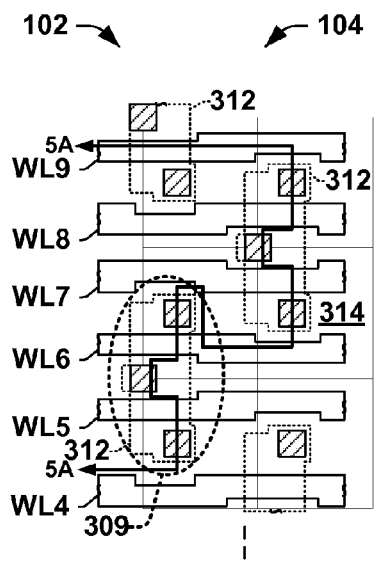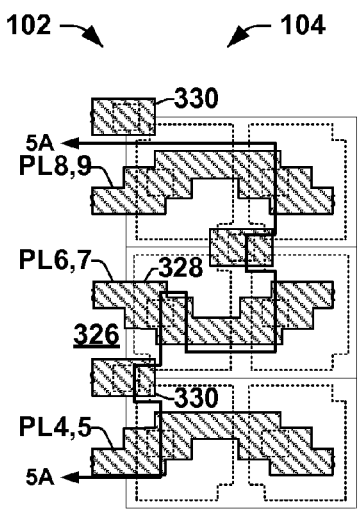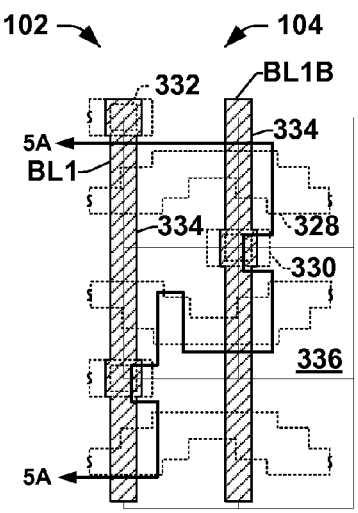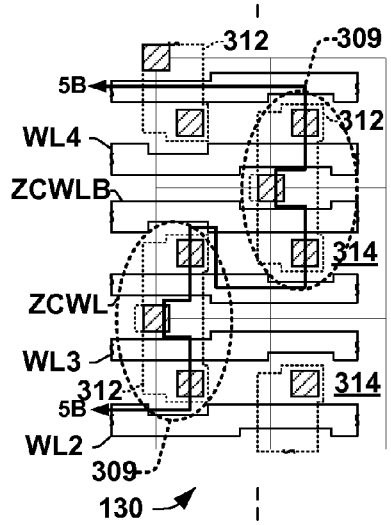
FIG. 5C  FIG. 5D  FIG. 5E

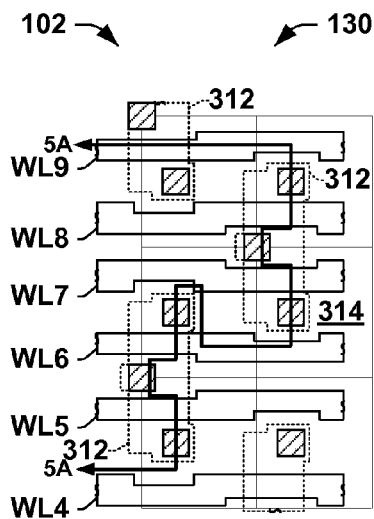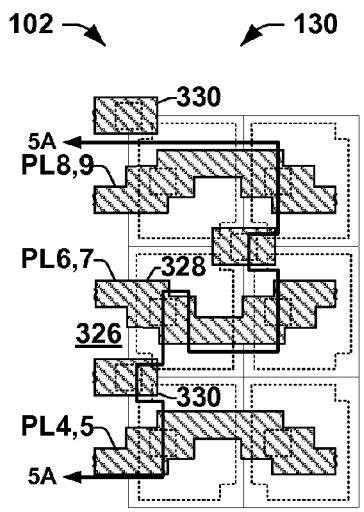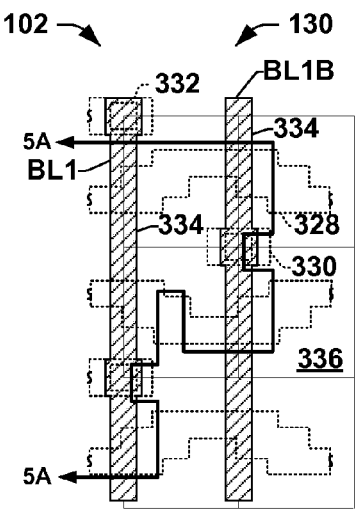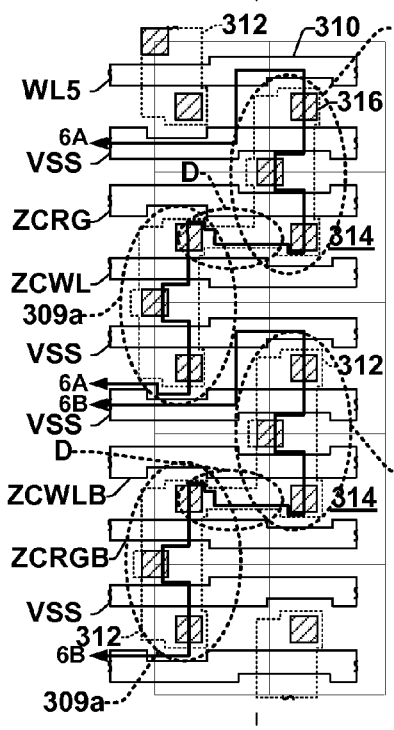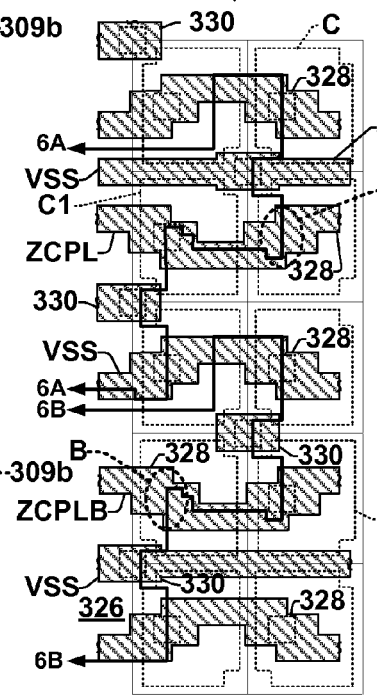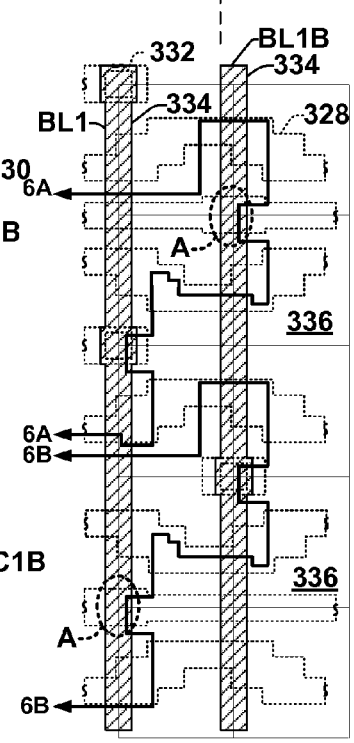
FIG. 6C  FIG. 6D  FIG. 6E

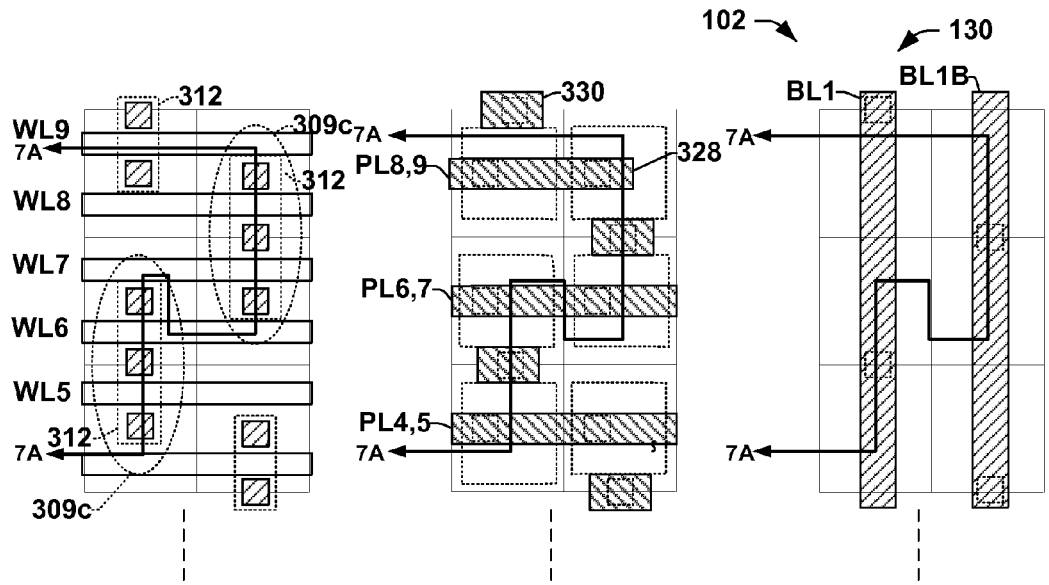
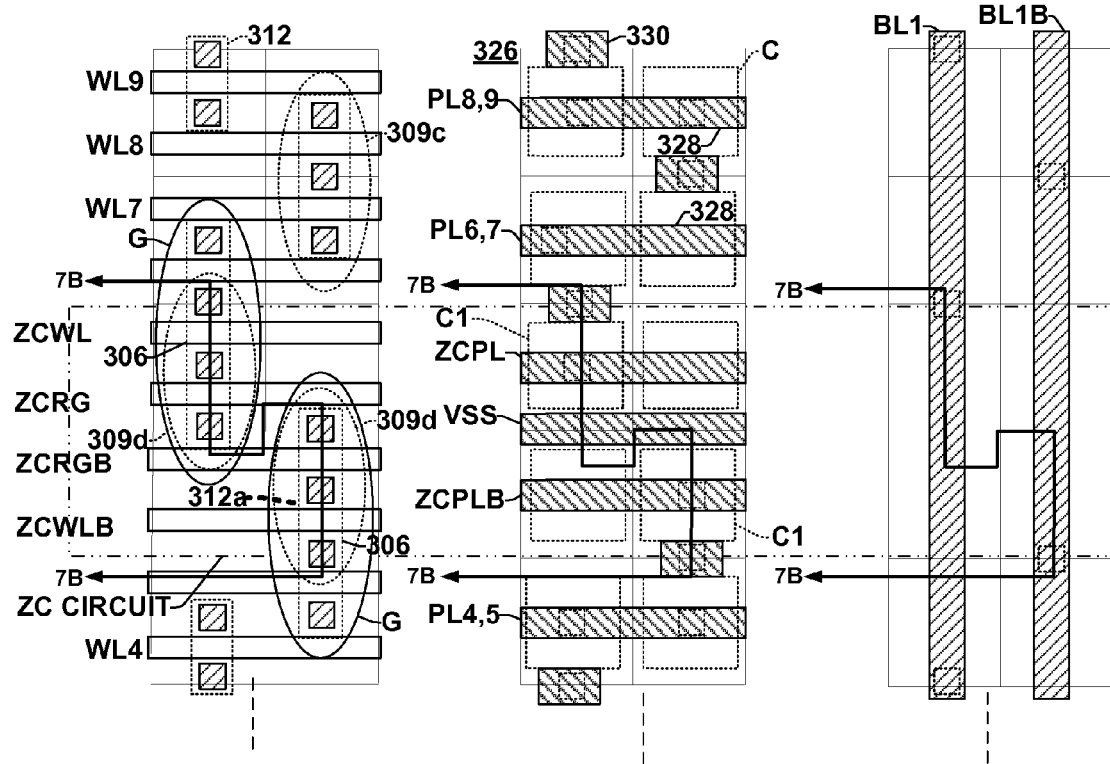
FIG. 7C  FIG. 7D  FIG. 7E

FERROELECTRIC MEMORY ARRAY FOR IMPLEMENTING A ZERO CANCELLATION SCHEME TO REDUCE PLATELINE VOLTAGE IN FERROELECTRIC MEMORY

REFERENCE TO RELATED APPLICATIONS

This application claims priority to Ser. No. 60/877,203 filed Dec. 26, 2006, which is entitled "Ferroelectric Memory Array for Implementing a Zero Cancellation Scheme to Reduce Plateline Voltage in Ferroelectric Memory."

FIELD OF INVENTION

The present invention relates generally to semiconductor devices and more particularly to improved apparatus and methods for reduced plateline voltages in ferroelectric memory devices.

BACKGROUND OF THE INVENTION

In semiconductor memory devices, data is read from or written to memory cells in the device according to decoded address information and various other control signals. Such memory devices are used for storage of data and/or program code in personal computer systems, embedded processor-based systems, video image processing circuits, communications devices, and the like. Ferroelectric memory devices are integrated circuits (ICs), such as dedicated memories or other ICs in which data is stored in ferroelectric cell capacitors, where the memory cells are commonly organized in single-transistor, single-capacitor (1T1C) or two-transistor, two-capacitor (2T2C) configurations. In a folded bitline 1T1C architecture, the individual ferroelectric memory cells typically include a ferroelectric (FE) capacitor adapted to store a binary data bit, together with a MOS access transistor, which operates to selectively connect the FE capacitor to one of a pair of complementary bitlines, with the other bitline being connected to a reference voltage for memory access operations. The individual cells are commonly organized as individual bits of a corresponding data word, where the cells of a given word are accessed concurrently along a selected array row through activation of corresponding platelines and wordlines by address decoding control circuitry.

Ferroelectric memory devices provide non-volatile data storage wherein memory cell capacitors are constructed using ferroelectric dielectric material, which may be polarized in one direction or another in order to store a binary value. The ferroelectric effect in such cell capacitors allows for the retention of a stable polarization in the absence of an applied electric field due to the alignment of internal dipoles within Perovskite crystals in the ferroelectric material. This alignment may be selectively achieved by controlled application of an electric field between the ferroelectric capacitor terminals that exceeds the coercive field of the material. Conversely, reversal of the applied field reverses the internal dipoles, wherein the response of the polarization of a ferroelectric capacitor to the applied voltage may be plotted as a hysteresis curve.

Data in a 1T1C ferroelectric memory cell is read by connecting a reference voltage to a first bitline (a reference bitline), and by connecting the cell capacitor between a complementary bitline (data bitline) and a plateline signal. A plateline pulse signal is then applied, whereby a differential voltage is provided on the bitline pair, which is connected to a differential sense amp circuit. The reference voltage is typically supplied at an intermediate voltage between the voltage associated with a ferroelectric capacitor storing a binary "0" and that of the capacitor storing a binary "1". The sensed differential voltage is buffered by the sense amp and provided to a pair of local IO lines, where the polarity of the differential voltage represents the data that was stored in the cell. The transfer of data between the ferroelectric memory cell, the sense amp circuit, and the local data bitlines is controlled by various access transistors, typically MOS devices, with switching signals being provided by control circuitry including address decoders and timing circuits in the device.

Connection of the ferroelectric cell capacitor between the plateline pulse and the bitline during a read operation causes an electric field to be applied to the cell capacitor. If the field is applied in a direction to switch or reverse the internal dipoles, more charge will be moved than if the dipoles are not reversed. As a result, the sense amplifier can measure the charge applied to the cell bitlines and produce either a logic "1" or "0" differential voltage at the sense amp terminals. Since reading the cell data is a destructive operation, the sensed data is then restored to the target memory cell following each read operation. To write data to the cell in a restore or data write operation, an electric field is applied to the cell capacitor by a sense amp or write buffer to polarize it to the desired state. Ferroelectric memories provide certain performance advantages over other forms of non-volatile data storage devices, such as flash and EEPROM type memories. For example, ferroelectric memories offer short programming (e.g., write access) times and low power consumption, and allow a relatively high number of write operations compared with flash and EEPROM memories.

Ferroelectric memory devices typically include a number of individually addressable memory cells arranged in an array configuration, wherein the array is typically organized as a matrix of rows and columns. Conventionally, data is stored into a memory array as a row, and read out from the memory array as a row, where the row typically consists of 8, 16, 32, or 64 bits of binary data. During a write or restore operation, row decoder control circuitry provides a plateline pulse signal to the first sides of the ferroelectric cells in a target array row, the other sides of which are connected to the array bitlines to receive the data. In a read operation, the decoder provides plateline pulses to the first side of each ferroelectric memory cell in a target array row, and sense amplifiers are connected to the other side of the cells to sense a row of stored data bits in parallel fashion. Thus, in a single read operation, an entire row of data bits (e.g., 8, 16, 32, or 64 bits) are obtained from the memory cells in the selected row.

FIGS. 1A-1C illustrate a portion of a ferroelectric memory device 2 organized in a folded bitline architecture, having 512 rows (words) and 64 columns (bits) of 1T1C data storage cells 6 indicated as $C_{ROW\text{-}COLUMN}$, where each column of cells 6 is accessed via a pair of complementary bitlines $BL_{COLUMN}$ and $BL_{COLUMN}B$. In the first row of the device 2 in FIG. 1A, for example, the cells C1-1 through C1-64 form a 64 bit data word accessible via a wordline WL1 and complementary bitline pairs BL1/BL1B through BL64/BL64B. The cell data is sensed during data read operations using sense amp circuits 12 (S/A C1 through S/A C64) associated with columns 1 through 64, respectively. In the illustrated configuration, the 1T1C cells 6 ($C_{ROW\text{-}COLUMN}$) individually include a single ferroelectric cell capacitor $C_{FE}$ and an access transistor (cell transistor) 10 that connects the cell capacitor $C_{FE}$ between one of the complementary bitlines associated with the array column and a plateline, where the other (complementary) bitline is selectively connected to a reference voltage generator 8 or 8B via one of a pair of switches 9a, 9b, depending upon which word is being accessed for read operations. In the device 2, cells along WL1 and WL2 (as well as those along WL5, WL6, WL9, WL10, ..., WL509, WL510) are coupled with bitlines BL1-BL64, whereas cells along WL3 and WL4 (as well as those along WL7, WL8, WL11, WL12, ..., WL511, WL512) are coupled with bitlines BL1B-BL64B. In reading the first data word along the wordline WL1, the cells C1-1 through C1-64 are connected to the sense amps via the bitlines BL1, BL2 ..., BL63, and BL64 while the complementary reference bitlines BL1B, BL2B ..., BL63B, and BL64B are connected to the reference voltage generators 8, 8B.

FIGS. 1B and 1C illustrate further details of one exemplary cell 6a (e.g., cell C1-1) in the device 2, which is coupled to bitline BL1, a wordline WL1, and a plateline PL1 (FIG. 1B), as well as a timing diagram 20 (FIG. 1C) showing waveforms or signals on various nodes during a read operation in the device 2. The 1T1C cell 6a in FIG. 1B includes a ferroelectric (FE) capacitor $C_{FE}1$ and a MOS access transistor 10a, where the capacitor $C_{FE}1$ is coupled between the transistor 10a and a plateline signal PL1, and the transistor 10a is coupled between the capacitor $C_{FE}1$ and the bitline BL1. Also illustrated is a corresponding sense amp 12 (S/A C1) coupled to the bitline BL1. During a read operation in the device 2, a signal level $V_1$ or $V_0$ is obtained on the array bitline BL1, depending upon the state of the data being read (e.g., binary "1" or "0", respectively). A reference voltage $V_{REF}$ from the shared reference generators 8, 8B is ideally between $V_1$ and $V_0$, which is then applied to the complementary bitline BL1B (e.g., coupled to the other input of the sense amp 12).

To read the data stored in the ferroelectric capacitor $C_{FE}1$, typically the access transistor 10a is turned on by applying a voltage Vwl which is greater than or equal to a supply voltage Vdd plus the threshold voltage of the transistor 10a via the wordline WL1 to couple the bitline BL1 to the capacitor $C_{FE}1$, and the plateline PL1 is thereafter pulsed high, as illustrated in FIG. 1C. This causes charge sharing between the ferroelectric capacitor $C_{FE}1$ and the bitline BL1 (e.g., bitline BL1 has a non-zero capacitance associated therewith, not shown), whereby the bitline voltage BL1 rises, depending upon the state of the cell data being read. To sense the cell data, the plateline PL1 is returned to 0V and the sense amp 12 is activated (e.g., via a sense amp enable signal SE). One input terminal of the sense amp 12 is coupled to the cell bitline (e.g., data bitline BL1) and the other differential sense amp input is coupled to a reference voltage (e.g., reference bitline BL1B in FIG. 1A in this example). In the example of FIGS. 1A-1C, the sense amp 12 is enabled after the plateline signal PL1 is again brought low, a technique referred to as "pulse sensing". Alternatively, "step sensing" can be used in the device 2, in which the sense amp is enabled via the SE signal while the plateline pulse PL1 is still high.

To optimize the signal level transferred from the capacitor $C_{FE}1$ to the bitline BL1 in a read operation, the plateline voltage PL1 should be high enough to ensure that the voltage across the capacitor $C_{FE}1$ is greater than about 90% of the saturation voltage value for the ferroelectric capacitor $C_{FE}1$. For example, where the saturation value of the capacitor $C_{FE}1$ is about 1.1 V, the voltage across the capacitor $C_{FE}1$ should be about 1 V or more during the read operation. If the voltage across capacitor $C_{FE}1$ is insufficient, the signal level strength at the sense amp 12 is weakened and the signal margin or sensing capability of the sense amp 12 suffers.

As can be seen in FIG. 1C, the bitline voltage BL1 is non-zero once the plateline signal pulse PL1 has been applied to the capacitor $C_{FE}1$, due to charge from the cell capacitor $C_{FE}1$ being transferred to the bitline BL1 and the bitline capacitance thereof. In one example, the bitline voltage BL1 can be of the order of 300-500 mV during the time that PL1 is high. For instance, where the ferroelectric capacitor $C_{FE}1$ has a saturation voltage of about 1.1 V, the bitline voltage BL1 rises to around 300 mV when reading a "0" data state, and to around 500 mV when reading a "1" data state during the time that the plateline PL1 is high. When the plateline PL1 is brought low, the bitline voltage BL1 reduces to around 50 mV for a "0" data state and to around 200 mV for a "1" data" state (e.g., in a range generally between about 25 and 250 mV). In this example, the reference voltage is about halfway between the "0" and "1" states, such as about 125 mV.

Since the ferroelectric capacitor voltage during the plateline pulse PL1 is the difference between the plateline pulse level PL1 and the bitline voltage on BL1, the plateline pulse signal PL1 itself needs to be much higher than the saturation voltage of the capacitor $C_{FE}1$, due to the non-zero bitline voltage. In the above example, the plateline pulse on PL1 in the device 2 needs to be about 1.5 V, in order to provide 1 V across the capacitor $C_{FE}1$ during the read operation. For low power devices, however, the supply level Vdd may not be this high. For example, if the device 2 operates at a supply level Vdd of only 1.3 V, the 1.5 V plateline pulse for PL1 must be generated by a charge pump circuit (not shown) or other voltage boosting circuitry.

Since the saturation voltage of a ferroelectric capacitor is dependent upon the ferroelectric material thereof, redesigning the device 2 for lower threshold ferroelectric capacitors is difficult, involving process integration issues related to processing a different material. Another shortcoming of conventional ferroelectric memories is designing the 1.5 V volt driver circuits for the plateline PL1 using 1.3 volt transistors. Moreover, the provision of special high voltages for plateline pulses also increases the device area and cost, and can degrade device reliability. Thus, there is a need for improved ferroelectric memory devices by which plateline voltage levels can be reduced for a given ferroelectric capacitor material type, without the need for voltage boost circuits.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present one or more concepts of the invention in a simplified form as a prelude to the more detailed description that is presented later.

The invention relates to zero cancellation circuitry and systems for coupling a negative charge to a memory array bitline through a zero cancellation capacitor while the cell plateline signal is applied during a read operation, which effectively reduces the bitline voltage when the cell plateline signal is high and thus allows more of the plateline voltage to be applied across the ferroelectric cell capacitor. As a result, the cell plateline voltage requirement can be reduced, thereby avoiding the need for voltage boost circuits, while still providing a high percentage of the saturation voltage across the ferroelectric cell capacitor during read operations. Before the cell plateline signal is removed, a positive charge is then applied to the bitline. In one example illustrated and described below, a negative pulse of a pre-determined magnitude is applied to the zero cancellation capacitor during the positive cell plateline pulse, in order to provide the negative charge and positive charge to the bitline. The negative pulse may be a low-going signal (e.g., a 2-level signal) or may comprise three pre-determined levels, with the first and third levels being greater than the second level.

In one aspect of the invention, ferroelectric memory devices are provided, wherein a memory array is provided with ferroelectric memory cells situated in rows along a wordline direction and columns along a bitline direction, with one or more zero cancellation circuits being coupled with array bitlines, where the zero cancellation circuits are substantially identical to the individual ferroelectric memory cells or memory super cell structures of the array. The zero cancellation circuits individually comprise a capacitor and a switching device that selectively couples the zero cancellation capacitor with the array bitline according to a zero cancellation wordline signal from a control system. The control system provides a zero cancellation plateline pulse to the zero cancellation capacitor while a memory array plateline signal is activated to provide a voltage across a target ferroelectric cell capacitor. The individual zero cancellation circuits may further comprise a discharge switching device that selectively couples the zero cancellation capacitor to a pre-determined voltage level according to a zero cancellation discharge wordline signal from the control system.

The memory array cells and zero cancellation circuits may be constructed as a multilayer structure with conductive contacts formed between layers, wherein at least one layer of the zero cancellation circuit is identical or substantially identical (e.g., similar) to that of the individual ferroelectric memory cells. In one example, the multi-layer structure comprises four layers, with the cell transistors, the zero cancellation switching devices, and the zero cancellation discharge switching devices being formed on or in a semiconductor body in a first layer, and with array wordlines extending along rows of ferroelectric memory cells, a zero cancellation wordline extending along the zero cancellation circuits, and a zero cancellation discharge wordline extending along the zero cancellation circuits in the first layer. A second layer comprises the ferroelectric cell capacitors and the zero cancellation capacitors, a third layer comprises array platelines extending along rows of ferroelectric memory cells and a zero cancellation plateline extending along the zero cancellation circuits, and a fourth layer includes array bitlines extending along columns of ferroelectric memory cells and zero cancellation circuits. In certain exemplary embodiments of the invention, the zero cancellation circuits are constructed using first layer layouts (e.g., including important wordline, contact, and active region configurations) that are identical or substantially identical to those of the array cells. In one example, one or more extra rows are added to the array, with minor modifications being made to the active regions and/or to the contacts between layers and/or metalization routing structures to form the zero cancellation circuits, thus avoiding adding complexity to the Optical Proximity Correction (OPC) for these layers and without significantly impacting the memory cells in the array rows nearest the zero cancellation circuits.

In another aspect of the invention, pairs of adjacent ferroelectric memory cells along a given column form a memory super cell structure comprising a single active region with two gates along adjacent array wordlines, a shared source/drain between the gates that is coupled with an array bitline in the fourth layer, and two ferroelectric cell capacitors in the second layer having bottom electrodes coupled with two outer source/drains in the active region and top electrodes coupled with array platelines in the third layer, wherein the zero cancellation circuits individually comprise a zero cancellation super cell structure that is substantially identical to at least one memory super cell structure.

In yet another aspect of the invention, the zero cancellation circuit including a discharge transistor is formed by arraying individual ferroelectric cells or a super cell.

The following description and annexed drawings set forth in detail certain illustrative aspects and implementations of the invention. These are indicative of but a few of the various ways in which the principles of the invention may be employed.

BRIEF DESCRIPTION OF THE DRAWINGS

FIG. 5C is a segmented partial top plan view of the array and zero cancellation system in section taken along lines 5C-5C of FIGS. 5A and 5B illustrating a first layer with active regions of a semiconductor body with overlying polysilicon and conductive contact structures in the first embodiment of the device of FIGS. 2A-3G;

FIG. 5D is a segmented partial top plan view of the array and zero cancellation system in section taken along lines 5D-5D of FIGS. 5A and 5B illustrating second and third layers with ferroelectric capacitors and first metal layer (M1) structures in the first embodiment of the device of FIGS. 2A-3G;

FIG. 5E is a segmented partial top plan view of the array and zero cancellation system in section taken along lines 5E-5E of FIGS. 5A and 5B illustrating a fourth layer with bitline structures in the first embodiment of the device of FIGS. 2A-3G;

FIGS. 6C, 6D, and 6E are segmented partial top plan views of the array of FIG. 5A and the zero cancellation system in section taken along lines 6C-6C, 6D-6D, and 6E-6E, respectively, in FIGS. 5A, 6A, and 6B illustrating the multilayer structure in the second embodiment of the device of FIGS. 2A-3G;

FIGS. 7C, 7D, and 7E are segmented partial top plan views of the array of FIG. 7A and the zero cancellation system of in section in FIG. 7B taken along lines 7C-7C, 7D-7D, and 7E-7E, respectively, in FIGS. 7A, and 7B illustrating the multilayer structure in the second embodiment of the device of FIGS. 2A-3G;

DETAILED DESCRIPTION OF THE INVENTION

Figure 1A:
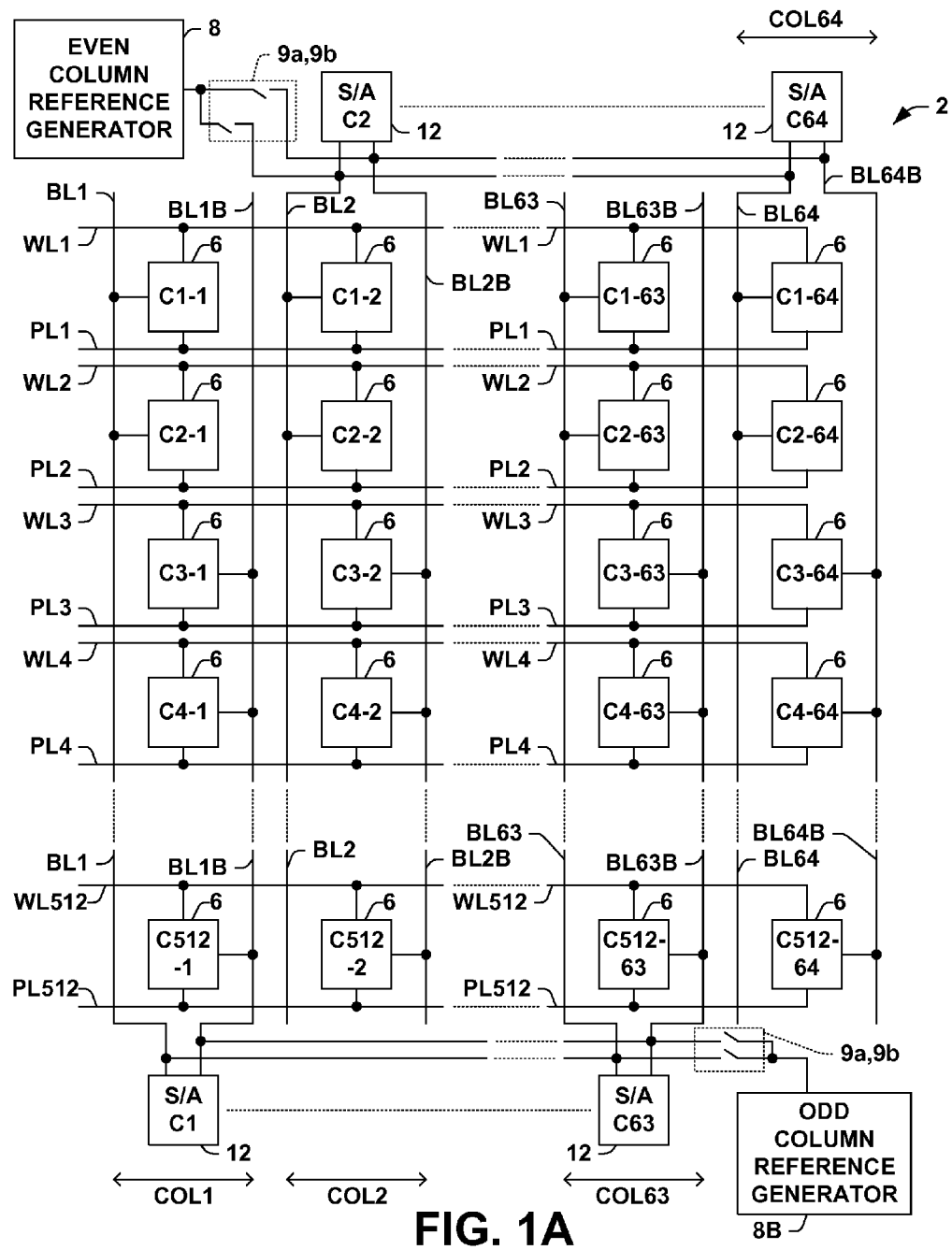
FIG. 1A is a schematic diagram illustrating a portion of a conventional 1T1C folded bitline ferroelectric memory device.
Figure 1B:
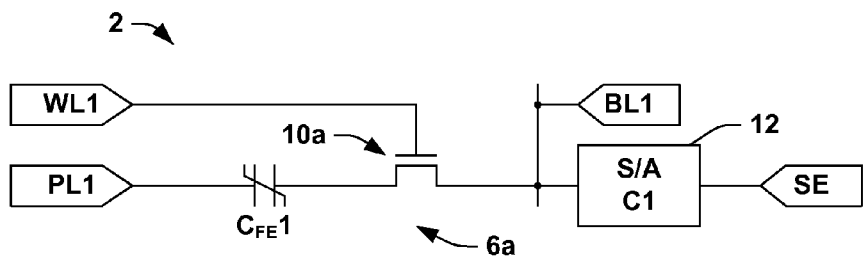
FIG. 1B is a schematic diagram illustrating a 1T1C cell and an associated sense amp in the device of FIG. 1A.
Figure 1C:
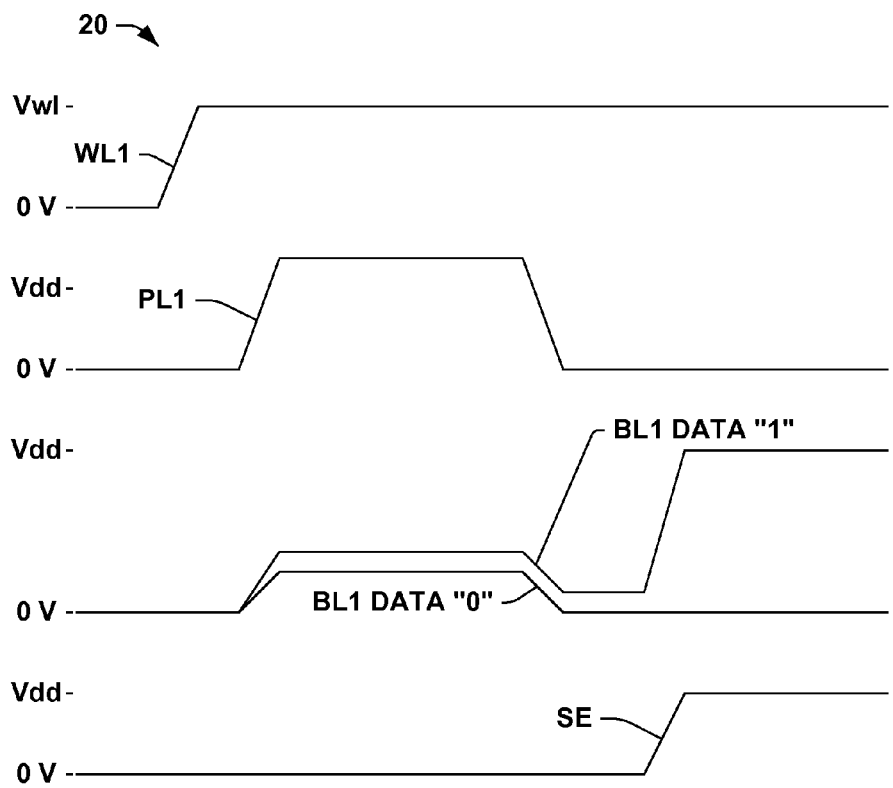
FIG. 1C is a waveform diagram illustrating operation of the cell of FIGS. 1A and 1B during a conventional read operation.

The present invention will now be described with reference to the attached drawing figures, wherein like reference numerals are used to refer to like elements throughout. One or more implementations of the present invention will now be described with reference to the attached drawings, wherein like reference numerals are used to refer to like elements throughout.

The invention relates to ferroelectric memory devices and zero cancellation systems in which negative and positive charges are applied to an array bitline during a read operation, to selectively lower the bitline voltage during a portion of the cell plateline pulse, thereby allowing reduced cell plateline voltage levels and facilitating reduced power consumption and elimination of the voltage booster circuitry used in conventional ferroelectric memory devices. One or more exemplary implementations are hereinafter illustrated and described in the context of folded bitline type ferroelectric memory architectures using single transistor-single capacitor (e.g., 1T1C) cells. However, the invention is not limited to the illustrated implementations, and may alternatively be employed with other cell types (e.g., 2T2C, etc.) and/or in other array architectures (e.g., open bitline, etc.), wherein all such alternate implementations where the zero cancellation circuits are substantially identical or identical to the memory cells are contemplated as falling within the scope of the invention and the appended claims.

FIGS. 2A-7D illustrate an exemplary ferroelectric memory device 102 in accordance with one or more aspects of the present invention, having zero cancellation circuits for selectively apply negative and positive charges to array bitlines during a read operations, wherein the zero cancellation circuits are identical to or substantially identical to the ferroelectric memory array cells or super cell structures thereof in the device 102. Any zero cancellation circuits with substantially identical or similar structures are contemplated as falling within the scope of the invention and the appended claims, which may be characterized as those requiring no modifications or only minor modifications relative to the memory cell or super cell structures. A first embodiment of the zero cancellation circuitry there is illustrated in FIGS. 5A-5E, a second embodiment is illustrated in FIGS. 6A-6E, and a third embodiment is illustrated in FIGS. 7A-7D.

In the exemplary device 102 illustrated and described below, the 1T1C array cells 106 (e.g., the data cells) are coupled with one of a pair of complementary array bitlines associated with an array column in a folded bitline array architecture, with rows of the memory cells being coupled with a corresponding array wordline and a corresponding array plateline. A ferroelectric memory device in accordance with the invention may be any integrated circuit or other structure in which ferroelectric memory cells are employed for data storage, wherein one or more zero cancellation circuits are provided to facilitate provision of adequate voltage levels across ferroelectric memory cell capacitors during memory access operations, and wherein the zero cancellation circuits are constructed using structures that are identical or substantially identical to those of the array cells or groups of cells (e.g., super cell structures). The ferroelectric memory devices of the invention may be employed in any type of applications, such as for storing data and/or program code in personal computer systems, embedded processor-based systems, video image processing circuits, communications devices, etc.

Figure 2A:
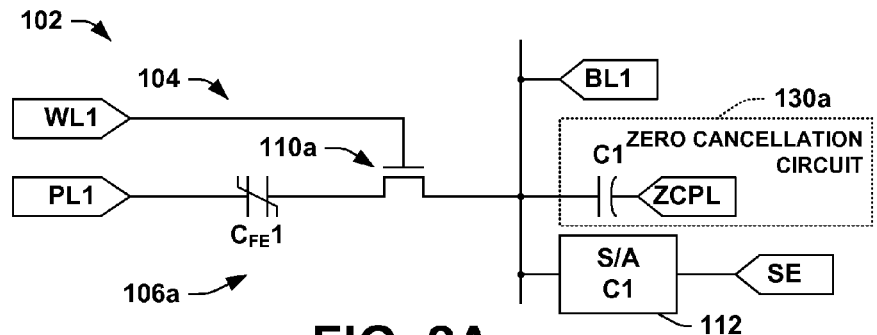
FIG. 2A is a schematic diagram illustrating a 1T1C ferroelectric memory cell with an associated sense amp, as well as an exemplary zero cancellation circuit in a folded bitline ferroelectric memory device in accordance with one or more aspects of the present invention.
Figure 2B:
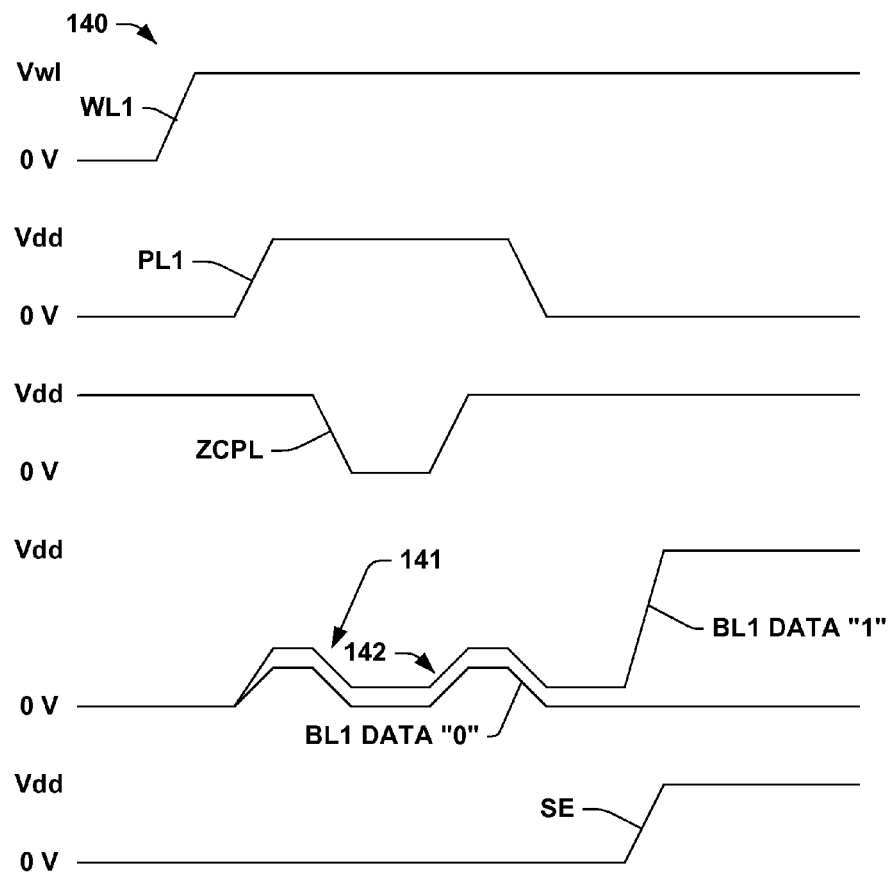
FIG. 2B is an exemplary waveform diagram illustrating operation of the cell of FIG. 2A during a read operation.

FIGS. 2A and 2B illustrate a portion of an exemplary 1T1C folded bitline memory array 104 in a ferroelectric memory device 102. FIG. 2A illustrates an exemplary 1T1C cell 106a and a corresponding zero cancellation circuit 130a along an array bitline BL1, and FIG. 2B illustrates a waveform diagram 140 in the device 102 during a read operation in accordance with the invention. As illustrated and described further below with respect to FIGS. 3A-3G, the exemplary cell 106a is part of a folded bitline array 104 in the device 102, wherein cells 106 are arranged in rows along a wordline direction and in columns along a bitline direction in the array 104. In the exemplary device 102, the cells 106 individually comprise a ferroelectric cell capacitor $C_{FE}$ and a cell transistor 110 (sometimes referred to as a pass gate). The exemplary cell 106a of FIG. 2A comprises a ferroelectric cell capacitor $C_{FE}1$ having a first terminal coupled with a cell transistor 110a and a second terminal coupled to receive a cell plateline signal pulse PL1 that is provided by a control system (e.g., control circuit 122 of FIG. 3F below).

The cell transistor 110a selectively couples the first capacitor terminal of the cell capacitor $C_{FE}1$ to the bitline BL1 that extends along a column in the array 104 according to an array wordline WL1 from the control system. The wordline and plateline signals WL1 and PL1 are selectively provided by the control system 122 (FIG. 3F) to access a target row of data cells according to decoded address information for read, write, and restore operations in the device 102. Sense amps 112 are coupled with bitlines along columns of the array 104 for reading (e.g., sensing) and writing cell data, wherein one terminal of a first sense amp S/A C1 112 is coupled with the bitline BL1, and another terminal (not shown) is coupled with a complementary bitline BL1B (e.g., as further illustrated in FIGS. 3A-3C below).

Figure 3A:
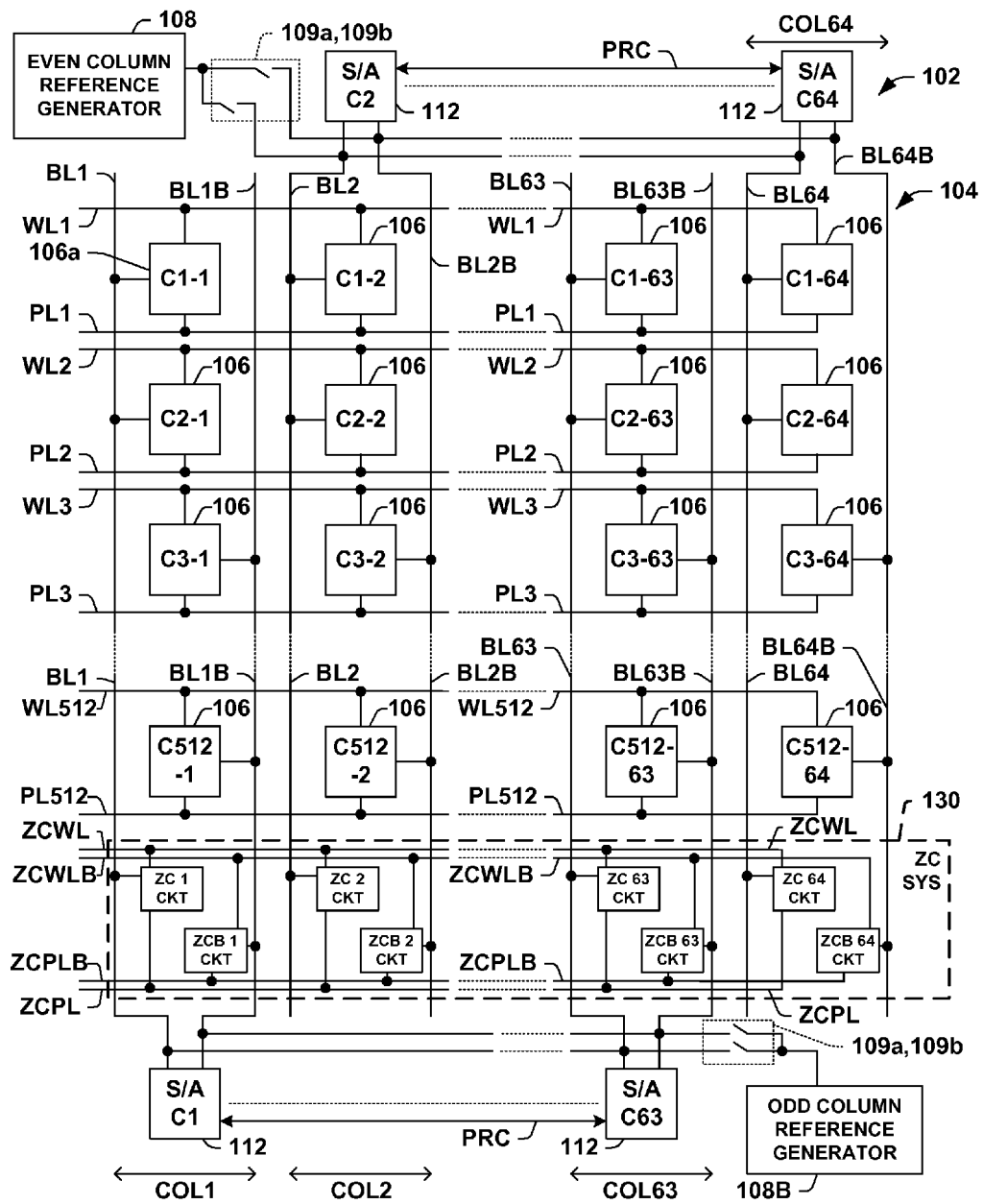
FIGS. 3A-3G are schematic and waveform diagrams further illustrating the exemplary ferroelectric memory device of FIGS. 2A and 2B.
Figure 3B:
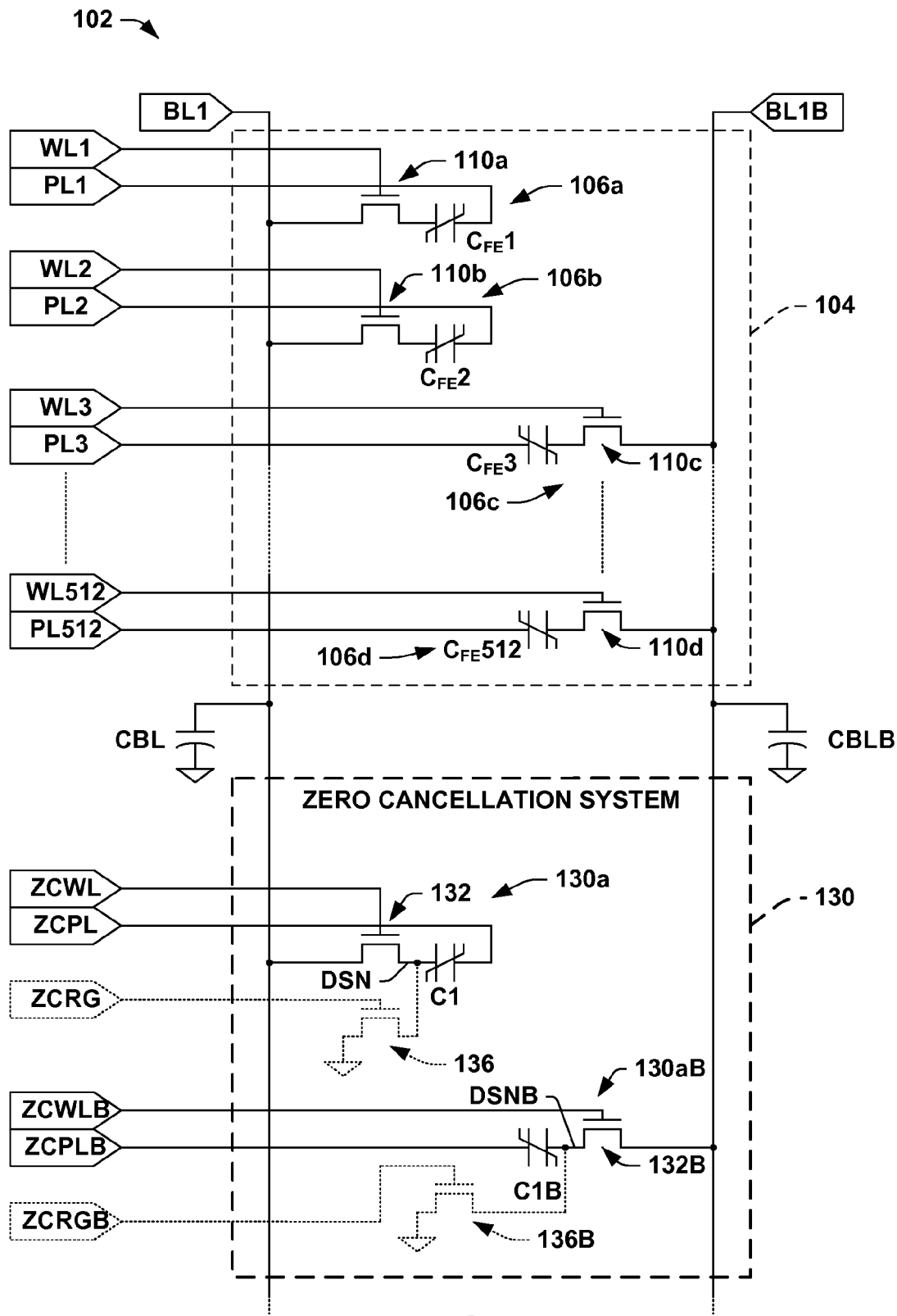

According to an aspect of the invention, the device 102 comprises a zero cancellation system 130 including a first zero cancellation circuit 130a for selectively reducing the voltage on the bitline BL1 during read operations. The zero cancellation circuit 130a comprises a zero cancellation capacitor C1 having a first terminal coupled with the bitline BL1 and a second terminal coupled with a zero cancellation plateline signal ZCPL activated by the control system, wherein the capacitor C1 may, but need not be a ferroelectric capacitor, which can be similar or identical to cell ferroelectric capacitor structure and layout. As illustrated and described in FIGS. 3A-3G below, the exemplary zero cancellation circuit 130a also comprises a zero cancellation switching device, such as a transistor to selectively couple the capacitor C1 with the bitline BL1 according to a zero cancellation wordline signal from the control system, and may optionally comprise a discharge switching device 136 (FIG. 3B below). In accordance with an aspect of the present invention, the exemplary zero cancellation circuits 130 of the device 102 are substantially identical to the individual ferroelectric memory cells 106, wherein one or more layers of a multi-layer structural implementation of the circuits 130 is identical or substantially identical to that of the memory cells 106. In the simplified illustration of FIG. 2A, the capacitor C1 is shown as being connected between the ZCPL signal and the array bitline BL1 for providing zero cancellation charging of the bitline BL1 according to the invention.

FIG. 2B illustrates operation of the cell 106a and the zero cancellation circuit 130a during a memory read operation, wherein the control system (e.g., control circuit 122 in FIG. 3F below) provides the array wordline and plateline control signals WL1 and PL1, respectively, as well as a zero cancellation plateline signal ZCPL and a sense amp enable signal SE as illustrated in the diagram 140. In the read operation, the control system 122 activates the cell plateline signal by providing a positive pulse on the cell plateline PL1 after the cell capacitor $C_{FE}1$ is coupled with the bitline BL1 via the cell wordline signal WL1. While the cell plateline PL1 is high, a negative going pulse ZCPL is applied to the zero cancellation capacitor C1 via a zero cancellation plateline signal from the control system 122. As ZCPL is brought low, negative charge is introduced through the capacitor C1 into the bitline BL1 and the bitline voltage at BL1 is decreased at 141 in FIG. 2B, thereby increasing the voltage across the ferroelectric cell capacitor $C_{FE}1$. This allows a lower cell plateline signal voltage PL1 (e.g., Vdd in this example), whereby the cell plateline pulse PL1 need not be higher than the supply voltage (e.g., no voltage boost circuitry is required). The zero cancellation plateline signal ZCPL is then brought high, thereby introducing a positive charge to the bitline BL1, which in turn raises the bitline voltage at 142 in FIG. 2B. The cell plateline PL1 is then deactivated (e.g., brought low again) and the sense amp 112 is enabled via the SE signal to begin the sensing operation. The example illustrated in FIG. 2B provides pulse sensing wherein the plateline PL1 is deactivated prior to the sense amp enable signal SE, although the invention may be alternatively employed in step sensing systems in which the sense amp 112 is enabled via SE going high prior to the plateline PL1 being deactivated.

Figure 3C:
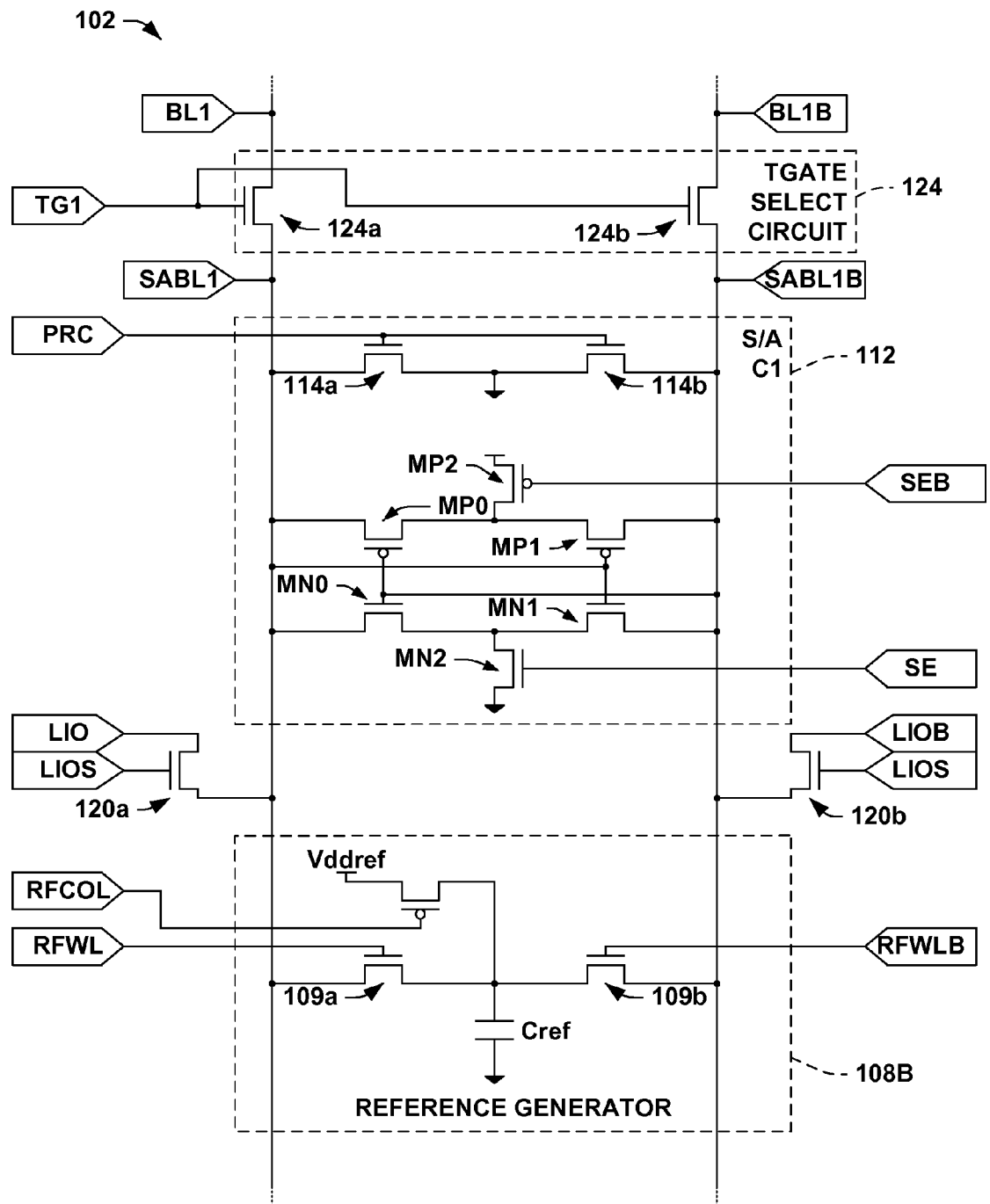
Figure 3D:
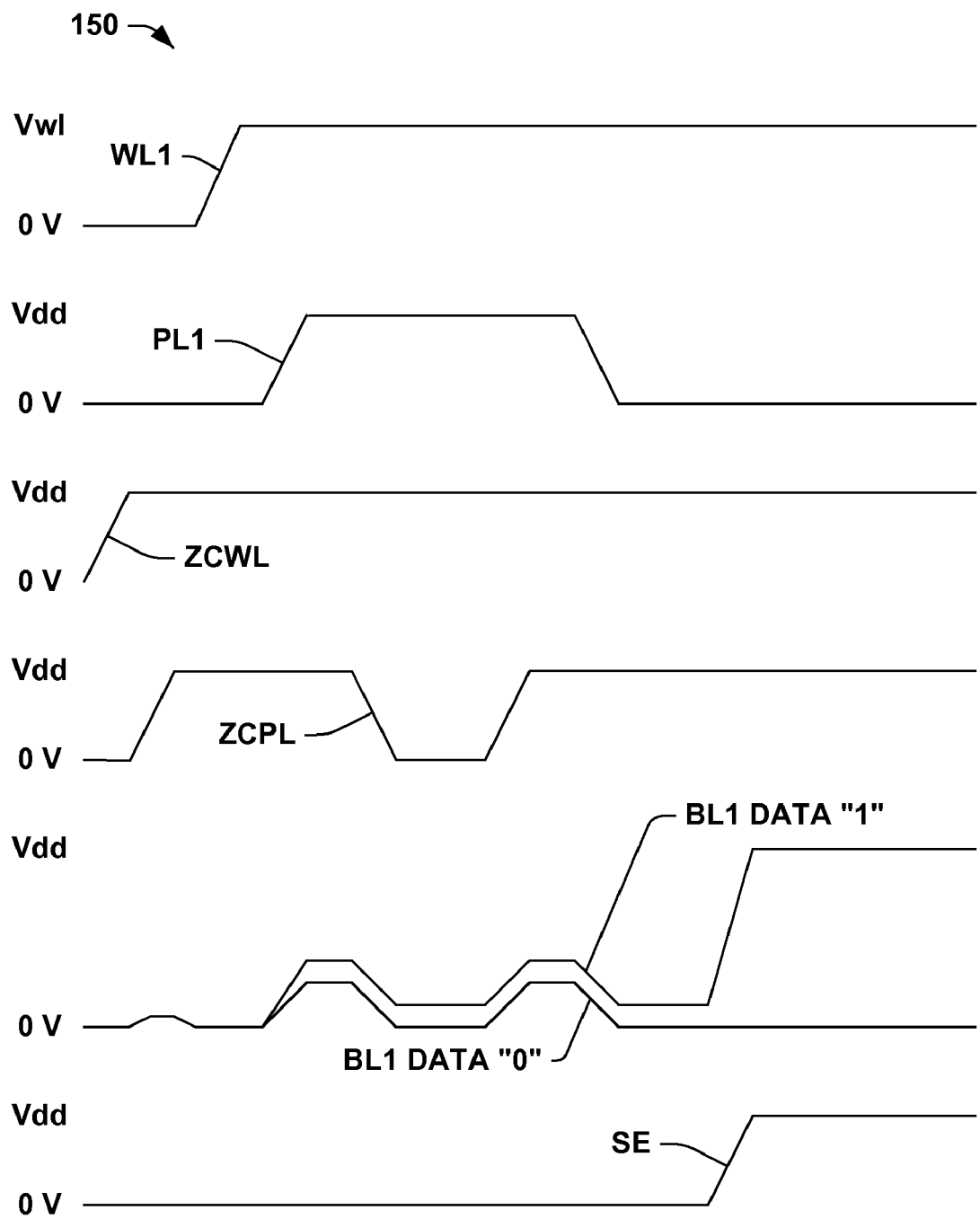
Figure 3E:
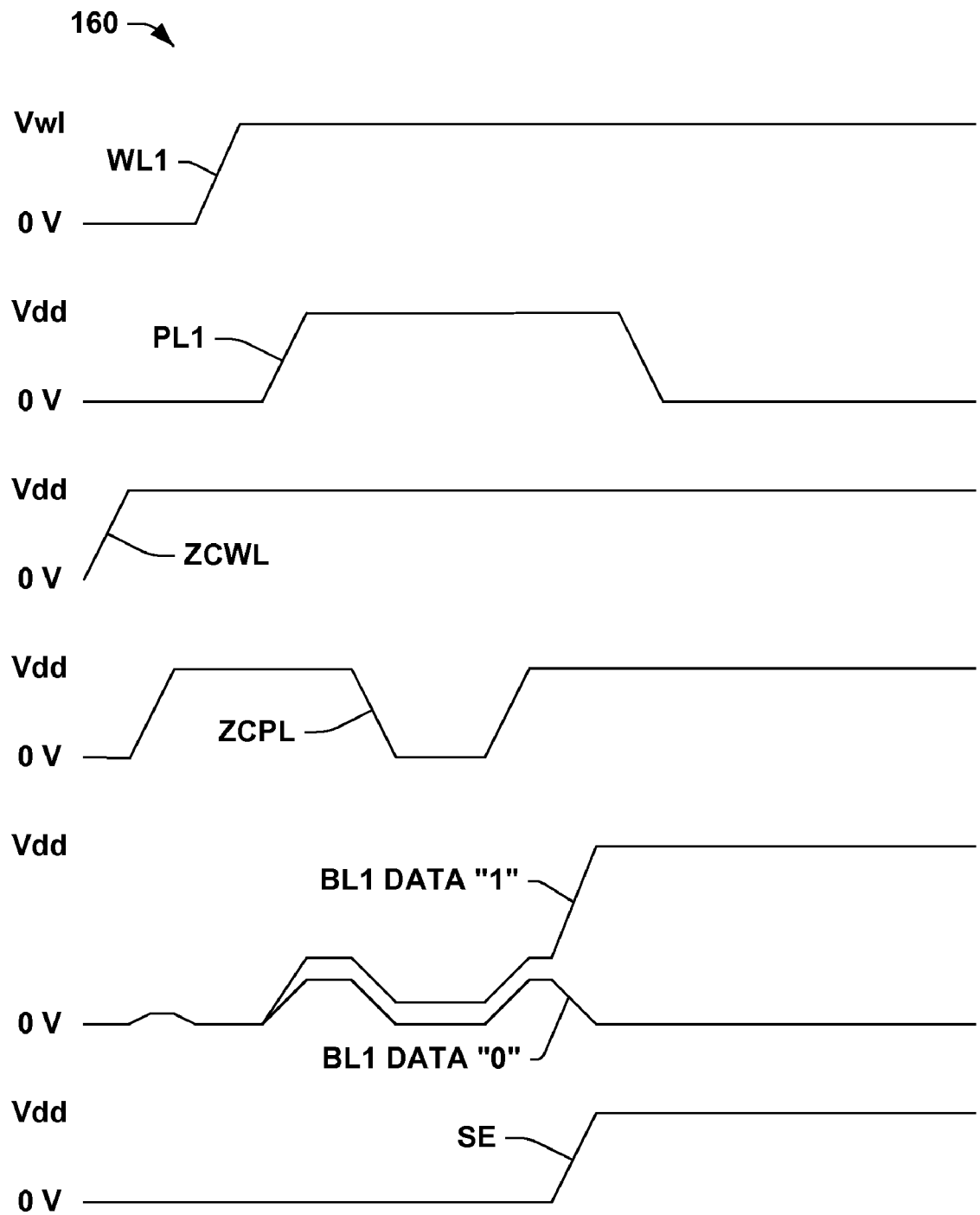
Figure 3F:
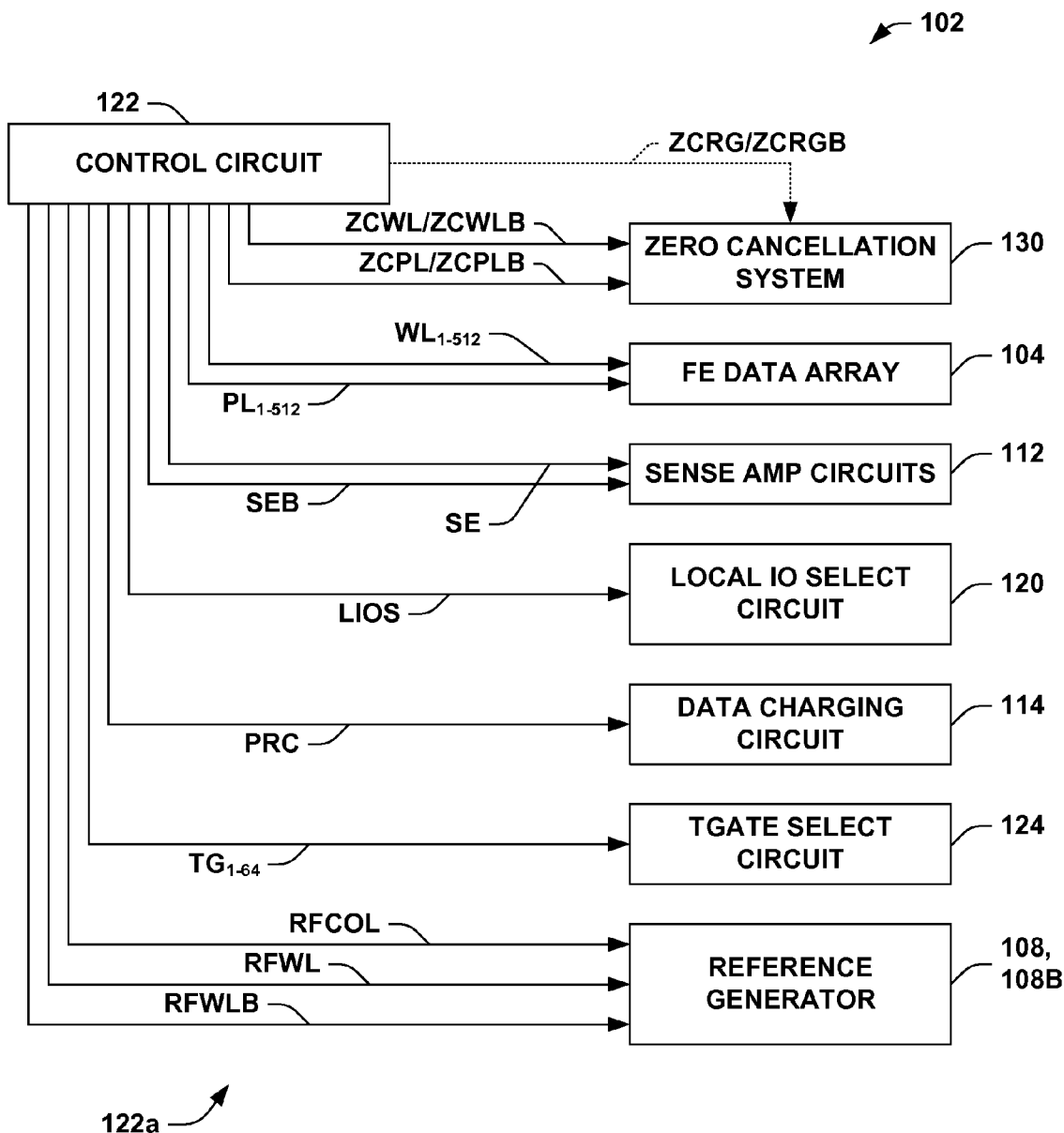

FIGS. 3A-3C and 3F illustrate further details of the exemplary ferroelectric memory device 102, wherein FIGS. 3B and 3C illustrate a portion of one exemplary column of the array 104. The device 102 comprises a folded bitline ferroelectric memory array 104 (FIG. 3A), reference generators 108 and 108B coupled with the bitlines of the array 104 via switches 109a and 109b, and sense amps 112. TGATE select circuits 124 (FIG. 3C) are provided to selectively couple the sense amps 112 with bitlines of the array 104, and a zero cancellation system 130 is provided in the device 102 in accordance with the invention. The ferroelectric memory array 104 (FIG. 3A) comprises 1T1C ferroelectric data memory cells 106 organized in rows along wordlines WL1-WL512 and columns along complementary data bitline pairs BL/BLB in a folded bitline configuration, wherein the wordlines WL1-WL512 and other control and timing signals 122a are provided by a control circuit 122 (FIG. 3F). In the exemplary array 104, the memory cells along WL1 and WL2 (as well as those along WL5, WL6, WL9, WL10, . . . , WL509, WL510) are coupled with bitlines BL1-BL64, whereas cells along WL3 and WL4 (as well as those along WL7, WL8, WL11, WL12, . . . , WL511, WL512) are coupled with the complementary bitlines BL1B-BL64B. In reading the first data word along the wordline WL1, the cells C1-1 through C1-64 are connected to the sense amps via the bitlines BL1, BL2 . . . , BL63, and BL64 while the complementary reference bitlines BL1B, BL2B . . . , BL63B, and BL64B are connected to the reference voltage generators 108, 108B. The wordline numbering of the device 102 is exemplary only, wherein other implementations are possible within the scope of the invention.

FIGS. 3B and 3C illustrate further details of the first column along the data bitline pair BL1/BL1B in the array 104, including a portion of the exemplary zero cancellation system 130 of the invention. Several exemplary ferroelectric memory data cells 106a-106d are illustrated in FIG. 3B comprising ferroelectric capacitors $C_{FE}1$-$C_{FE}512$ and MOS cell access transistors 110a-110d configured in a column along the bitlines BL1 and BL1B. The exemplary ferroelectric data memory array 104 comprises an integer number "n" of such columns, for example, 64 columns in the illustrated device 102. The ferroelectric cell capacitors $C_{FE}$ of the data array 104 may be fabricated from any appropriate ferroelectric material in a wafer, such as Pb(Zr,Ti)O3 (PZT), (Ba,Sr)TiO3 (BST), SrTiO3 (STO), SrBi2Ta2O9 (SBT), BaTiO3 (BTO), (Bi1-xLax) 4Ti3O12 (BLT), or other ferroelectric material fabricated between two conductive electrodes to form a ferroelectric capacitor $C_{FE}$.

The data memory cells 106a-106d along the column of FIG. 3B and the contents thereof are accessed during read, restore, and write operations via the complementary array bitlines BL1 and BL1B through activation of the wordline and plateline signals WL1-WL512 and PL1-PL512, respectively. For example, the ferroelectric capacitor $C_{FE}1$ of the first row is coupled with the bitline BL1 via the first wordline signal WL1 and an access transistor 110a, and the cell capacitor $C_{FE}1$ is accessed via activation of a cell plateline signal (e.g., pulse) PL1 from the control system 122 in FIG. 3F. In the illustrated implementation, the array bitline is initially precharged to ground (e.g., Vss or 0V) via precharge transistors 114a and 114b in the sense amp 112 (FIG. 3C) according to a precharge control signal PRC from the control system 122 (FIG. 3F), and the plateline signal is activated by bringing the plateline PL1 to Vdd or some other positive voltage, thereby creating a voltage across the cell capacitor $C_{FE}1$.

In other implementations, the plateline signal can be activated by any signal on the plateline PL1 or combination of plateline and bitline control signals by which a voltage is created across the cell capacitor $C_{FE}1$ (e.g., the plateline voltage is different than the bitline voltage) to access (e.g., read) the data thereof. Thereafter, the plateline signal PL1 is deactivated (e.g., before or after enabling the sense amp 112) by bringing the plateline voltage at the second cell capacitor terminal back to about its original value. Other implementations are possible, for example, wherein the plateline and bitline voltages are initially at the same voltage level (e.g., bitline and plateline initially precharged to Vss), after which the data bitline BL1 is pulsed high or low to a different voltage to create the cell capacitor voltage, wherein such implementations are also deemed to involve 'activating' a plateline signal, even where the plateline voltage itself does not initially change. Thus, the plateline signal activation comprises any signal changes by which a voltage is created across the ferroelectric target cell capacitor $C_{FE}1$, wherein all such variant implementations are contemplated as falling within the scope of the present invention and the appended claims.

During the read operation, a reference voltage is supplied to the complementary bitline BL1B (e.g., the reference bitline in this case) via reference generator 108B by charging a reference capacitor Cref to a voltage Vddref (FIG. 3C) according to a signal RFCOL from the control system 122. The charged reference capacitor Cref is then selectively coupled to one of the complementary bitlines BL1 or BL1B (e.g., to BL1B in this example) according to control signals RFWL and RFWLB, respectively, from the control system 122. The corresponding sense amp 112 then senses the differential voltage on the bitline pair BL1/BL1B to ascertain the data state stored in the target cell 106a. The data may then be transferred to I/O circuitry, and is also written back into the target cell in a restore operation following the data read.

During a read operation, the sense amp 112 and the sense amp bitlines SABL/SABLB thereof (FIG. 3C) are coupled with the array bitlines BL1/BL1B via the transistors 124a and 124b in the TGATE select circuit 124 according to a signal TG1 from the control system 122 (FIG. 3F). The bitlines BL1/BL1B are precharged to ground via the precharge circuit 114a, 114b of the sense amp 112 according to signal a PRC from the control system 122. As illustrated in FIG. 3B, the exemplary sense amp 112 along the first array column bitlines BL1 and BL1B comprises NMOS transistors MN0, MN1, and MN2 as well as PMOS transistors MP0, MP1, and MP2. The sense amp 112 is enabled using sense amp enable signals SE and SEB provided by the control circuit 122 to sense amp transistors MN2 and MP2, respectively. An IO select circuit comprising transistors 120a and 120b selectively couples the sense amp bitlines SABL1/SABL1B with local IO lines LIO and LIOB, respectively, according to a local IO select control signal LIOS from the control circuit 122.

As illustrated in FIG. 3B, the zero cancellation system 130 comprises a first zero cancellation circuit 130a along the first array column, comprising a ferroelectric zero cancellation capacitor C1 and a zero cancellation switching device (e.g., transistor) 132 that selectively couples the capacitor C1 with the bitline BL1 according to a zero cancellation wordline signal ZCWL. The system 130 further provides another zero cancellation circuit 130aB along the complementary bitline BL1B of the first column, comprising a ferroelectric zero cancellation capacitor C1B and a zero cancellation transistor 132B to couple the capacitor C1B with the complementary BL1B according to a control signal ZCWLB. The control system 122 further provides the corresponding zero cancellation plateline signals ZCPL and ZCPLB to the other terminals of the zero cancellation capacitors C1 and C1B, respectively, as illustrated below in FIGS. 3D and 3E. The exemplary zero cancellation system 130 may further provide for discharging the first terminals of the zero cancellation capacitors C1 and C1B to ground (e.g., at zero cancellation circuit storage nodes DSN and DSNB in the system 130), using optional zero cancellation discharge switching devices (e.g., discharge transistors) 136 and 136B according to discharge signals ZCRG and ZCRGB, respectively, from the control system 122. FIGS. 6A-7D below illustrate two such exemplary embodiments of the zero cancellation system 130 with the zero cancellation discharge switching devices 136 and 136B, whereas FIGS. 5A-5E illustrate another possible embodiment wherein the optional discharge switching devices are omitted.

Referring also to FIGS. 3D and 3E, waveform diagrams 150 and 160 are illustrated for read operations using pulse sensing and step sensing, respectively, in the first column of the exemplary device 102. As can be seen in the diagrams 150 and 160, the control system 122 activates or provides the array plateline PL1 and wordline WL1 signals to the array 104 as well as the appropriate zero cancellation wordline signals ZCWL/ZCWLB to the zero cancellation switching devices 132 for coupling first terminals of the zero cancellation capacitors C1/C1B with the array bitlines BL1/BL1B, respectively, according to the array row being read. In addition, the control system 122 provides a negative zero cancellation plateline pulse ZCPL/ZCPLB to second terminals of the capacitors C1/C1B while the corresponding array cell plateline signals PL1/PL1B are provided to a target ferroelectric cell capacitor $C_{FE}$.

In the example of FIG. 3D, cell data is read from the exemplary cell 106a along the first wordline WL1 and the first bitline BL1. The control system 122 raises ZCWL to couple the zero cancellation capacitor C1 to the array bitline BL1, and also raises the zero cancellation plateline signal ZCPL to a first voltage level (e.g., Vdd in this example). While the ZCPL signal is raised, the precharge control signal PRC is ON. Raising the ZCPL signal causes the BL1 voltage to rise, but since the PRC is ON, the BL1 voltage discharges to Vss through the precharge transistor 114a (FIG. 3C). Subsequently, PRC is turned OFF by the control system 122 to float the data bitline BL1 prior to activating the target memory cell 106a via the wordline WL1. The array wordline WL1 is then brought high, thereby coupling the target capacitor $C_{FE}1$ in the target array cell 106a with the data bitline BL1. The array plateline signal PL1 is then activated by providing a positive pulse on the array plateline PL1, thereby creating a voltage across the target ferroelectric cell capacitor $C_{FE}1$. This causes the data bitline voltage on BL1 to rise, wherein the bitline voltage is dependent upon the data state value stored in the cell capacitor $C_{FE}1$. In the illustrated example, the array plateline PL1 need only be raised to Vdd, wherein the zero cancellation system 130 of the invention lowers the bitline voltage on BL1, whereby no voltage boost circuits are needed for generating the plateline pulse PL1.

While the array plateline signal PL1 is activated (e.g., high in this example), the control circuit 122 provides a negative going zero cancellation plateline pulse ZCPL to the zero cancellation capacitor C1. In the illustrated implementation, the zero cancellation plateline signal ZCPL comprises a first voltage level Vdd during a first time period, a second voltage level (e.g., ground or Vss) during a second time period, and a third voltage level Vdd during a third time period, wherein the first and third voltage levels are greater than the second voltage level. Any negative pulse may be provided to the capacitor C1 to selectively reduce the bitline voltage on BL1 within the scope of the invention, wherein the first and third voltage levels are equal and the first, second, and third voltage levels are all positive in the illustrated example. Other negative pulses are possible within the scope of the invention, for example, wherein the second and third voltage levels are the same.

As ZCPL is brought low in FIG. 3D, negative charge is introduced through the zero cancellation capacitor C1 into the data bitline BL1 and the bitline voltage at BL1 is thus decreased or reduced. This reduction in the bitline voltage BL1 advantageously increases the voltage applied across the ferroelectric cell capacitor $C_{FE}1$ (e.g., the voltage across $C_{FE}1$ at any time is the cell plateline voltage PL1 minus the data bitline voltage BL1), wherein the reduced data bitline voltage depends upon the data stored in the target cell 106a. Thus, compared with the conventional device 2 above, the zero cancellation system 130 of the present invention allows use of a lower cell plateline voltage PL1 (e.g., Vdd in this example), whereby no voltage boost circuitry is needed. The ZCPL signal is then brought high while the array plateline signal PL1 remains activated (e.g., high), thereby introducing a positive charge back into to the data bitline BL1. In the illustrated example where the first and third voltage levels of the signal ZCPL are the same, the positive charge is generally the same as the negative charge provided when the ZCPL signal was initially lowered, although this condition is not required within the scope of the invention. Any small variation due to process, supply voltage, temperature etc., in the negative zero cancellation plateline pulse amplitude and/or in the zero cancellation capacitor value C1 do not significantly impact the final signal value on the BL1. However, the final signal value on the data bitline BL1 will be impacted because more switched charge will flow from the ferroelectric cell capacitor $C_{FE}1$ due to the increased voltage across the ferroelectric cell capacitor $C_{FE}1$ compared to a case when the ZCPL signal is not pulsed negatively.

In the example above, the first and the third pre-determined voltage levels are Vdd and the second voltage level is Vss or 0V. When array plate line PL1 is high at Vdd and the zero cancellation plateline signal ZCPL is low at Vss, for a case where the zero cancellation capacitor C1 has same value as that of the ferroelectric cell capacitor $C_{FE}1$, the BL1 data "0" voltage level is 0V. In that case, a full Vdd is applied across the cell capacitor $C_{FE}1$ by operation of the cell plateline pulse PL1 and the zero cancellation system. In this example, the BL1 data "0" signal has been lowered or cancelled completely during the time the cell plateline signal PL1 is at Vdd and the ZCPL signal is at Vss. In other cases, the lowered BL1 data "0" can be negative, zero, or a positive voltage, depending upon the cell plate line PL1 high voltage level, the ZCPL negative pulse voltage amplitude, the cell capacitance $C_{FE}1$, and/or the zero cancellation capacitor C1 values. In the case where the BL1 voltage is negative when the cell plateline PL1 is high at Vdd, the voltage across the cell capacitor $C_{FE}1$ is raised to greater than Vdd, which may be advantageous in certain applications, provided the circuit reliability is not adversely impacted. Another consideration is that such a negative voltage on the data bitline BL1 may forward bias diffusion junctions, whereby the bitline BL1 may accumulate charge from surrounding circuit elements if the bitline voltage at BL1 exceeds a few hundred mV, which is not typically desired.

During the sensing of the data in the memory cell 106a, a reference voltage is applied to the complementary bitline BL1B, for example, using reference generator 108B and switch 109a in FIG. 3C. This creates a differential voltage at the input terminals of the sense amp 112 (e.g., sense amp bitlines SABL1 and SABL1B), the polarity of which indicates the data stored in the target data cell 106a. In the pulse sensing example of FIG. 3D, the cell plateline PL1 is then brought low (e.g., deactivated) and the sense amp 112 is thereafter enabled via the SE signal from the control system 122 to begin the data sensing operation. Alternatively, step sensing may be employed as shown in the diagram 160 of FIG. 3E, wherein the sense amp enable signal SE is brought high prior to deactivating the array plateline signal PL1 (e.g., prior to bringing PL1 low). As illustrated in FIGS. 3D and 3E, once the sense amp enable signal SE is raised, the sense amp 112 clamps the bitlines BL1 and BL1B to Vdd and 0 V (e.g., latches the sensed data), depending on the cell data state, and thereafter the local I/O signal LIOS can be asserted to provide the latched cell data to I/O circuitry (not shown).

In the illustrated implementation, the control system 122 raises the zero cancellation plateline signal ZCPL high, and discharges the data bitline BL1 and the internal node DSN of the zero cancellation circuit 130a by asserting the PRC signal to the transistor 114a, before prior to bringing the array wordline WL1 high. In another possible implementation, the zero cancellation discharge switching device 136 is provided in the zero cancellation circuit 130a (shown in phantom in FIG. 3B) to selectively couple the first zero cancellation capacitor terminal (e.g., the storage node DSN) to Vss (zero volts) according to a zero cancellation discharge signal ZCRG from the control system 122. In this case, the ZCRG signal is provided prior to the ZCWL signal so that the zero cancellation capacitor C1 is not coupled to the array bitline BL1 until the zero cancellation circuit storage node DSN is discharged, thereby allowing the array wordline WL1 to go on sooner, wherein the zero cancellation wordline signal ZCWL may be asserted after the array plateline signal PL1 is raised.

Figure 3G:
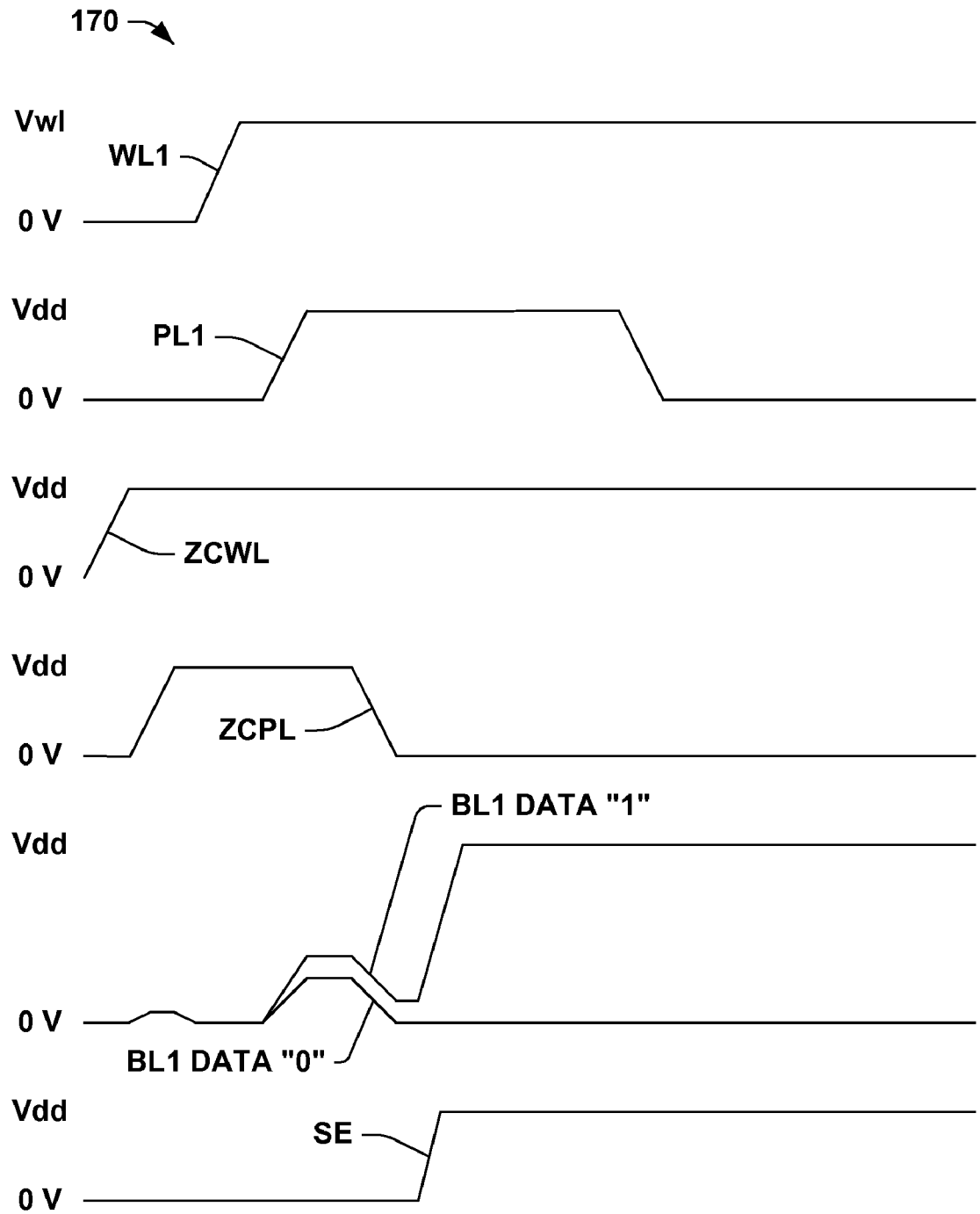

Referring now to FIG. 3G, another possible implementation is illustrated in which the zero cancellation plateline signal ZCPL is initially brought high (e.g., at a first voltage level) when the array plateline signal PL1 is activated (e.g., brought high), after which the zero cancellation plateline signal ZCPL is lowered to a second voltage level (e.g., while PL1 remains activated high), resulting in the bitline voltage BL1 being lowered or reduced. In this example, the sense amp 112 is enabled via the SE signal while the array plateline signal PL1 is activated and while the zero cancellation plateline signal ZCPL is low. In this example, the ZCPL signal need not be raised prior to sensing, wherein the reference voltage on the complementary array bitline BL1B may be adjusted accordingly to a level between the lowered data bitline voltages on BL1 for the "1" and "0" data states. The approach of FIG. 3G may save time in read operations compared with those of FIGS. 3D and 3E because the sense amp 112 is activated sooner via the signal SE. However, the approach of FIG. 3G may introduce additional offsets in the signal levels and degrade the sensing signal margins for the sense amp 112 after repeated accesses of the memory array 104 over time. For instance, where the zero cancellation capacitor C1 is made from ferroelectric material, then one or more ferroelectric material characteristics (e.g., such as fatigue, imprint, etc.) may change the properties of the zero cancellation capacitor C1, for example, including the capacitance value, and thus may degrade the signal margins over time. In such a ferroelectric memory array 104, matching of zero cancellation capacitor values in different columns may thus be desired to avoid or mitigate degradation in the signal margins. Also the approach of FIG. 3G may be sensitive to the amplitude of the negative zero cancellation plateline pulse, which can change with supply voltage and temperature. However, another advantage of the above scheme of FIG. 3G is that if the signal BL1 data "0" is a negative voltage and signal BL1 data "1" is a positive voltage when the array plateline PL1 is active high and ZCPL is low at the second voltage, the reference voltage on the complementary bitline BLB1 can be simply 0V or Vss, in order to simplify the reference generation circuits 108, 108B.

Figure 4:
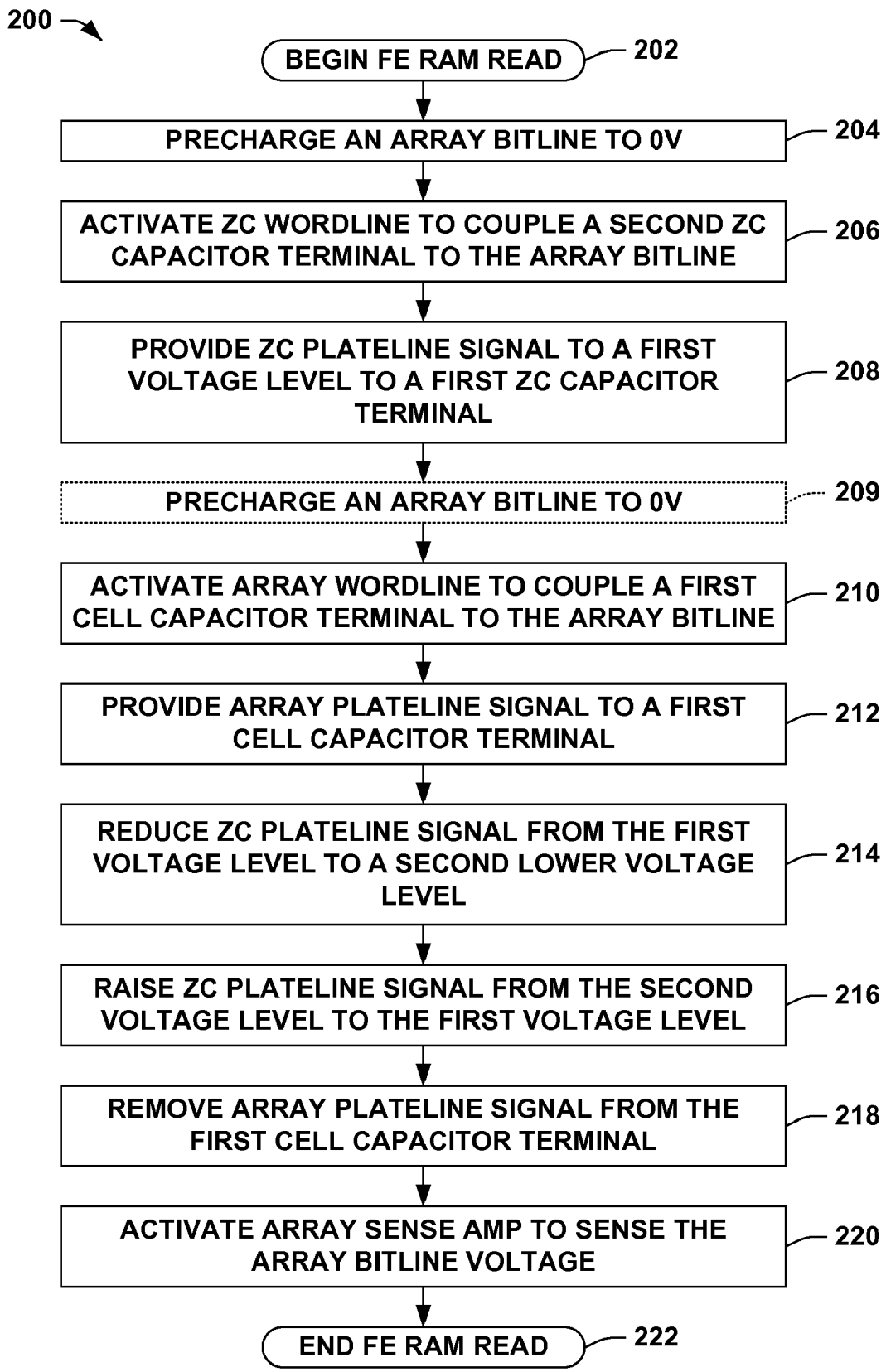
FIG. 4 is a flow diagram illustrating an exemplary method of reading a ferroelectric memory cell in accordance with the invention.

Referring now to FIG. 4, an exemplary method 200 is illustrated for reading ferroelectric memory data, which may be carried out in the exemplary device 102 or other ferroelectric memory devices of the invention. Beginning at 202, an array bitline in a ferroelectric data array is precharged at 204 to a first voltage. For example, in the illustrated device 102 above, the array bitline BL1 in the device 102 is precharged to ground (e.g., 0 V) via assertion of the PRC signal by the control system 122. At 206, a first terminal of a zero cancellation capacitor is coupled to an array bitline by activating a zero cancellation wordline signal (e.g., ZCWL). At 208, a zero cancellation plateline signal (e.g., ZCPL) is applied to the zero cancellation capacitor at a first voltage level (e.g., Vdd in the above example). At 209, the array bitline may again be precharged to 0V (e.g., Vss). At 210, a ferroelectric cell capacitor is coupled to the data bitline by activating an array wordline signal (e.g., WL1). At 212, an array plateline signal is activated to create a voltage across the ferroelectric cell capacitor (e.g., PL1 is brought high in the above example). In accordance with an aspect of the invention, the zero cancellation plateline signal (e.g., ZCPL) is then lowered to a second voltage level at 214, thereby introducing a negative charge onto the array bitline while the array plateline signal (e.g., PL1) remains activated high. This negative charge reduces the data bitline voltage, whereby a higher effective voltage is applied to the ferroelectric cell capacitor (e.g., plateline voltage-bitline voltage). Thereafter at 216, the zero cancellation plateline signal is raised to the original first voltage level, by which a positive charge is provided to the array bitline. The array plateline signal (e.g., PL1) is then deactivated at 218 (e.g., brought back to about it's initial level 0 V), and an array sense amp is enabled or activated at 220 to sense the array bitline voltage (e.g., to sense the data state read from the target array cell). The data may then be transferred to I/O circuitry and is also rewritten to the target cell and the read operation method 200 ends at 222.

In the illustrated example, both the first and second voltage levels are positive, or the second voltage can alternatively be 0 V. Alternatively, or one or both of these voltage levels may be negative within the scope of the invention. In addition, the above example raises the zero cancellation plateline signal (e.g., ZCPL) from the second voltage level back to the original (e.g., first) voltage level at 216. However, other implementations are possible, for example, wherein the ZCPL is lowered to the second voltage before or concurrently with the array plateline PL1 being activated. In another variation, the zero cancellation plateline signal ZCPL may be raised concurrently with or after the array plateline signal PL is deactivated (e.g., brought low).

In another possible implementation, the zero cancellation plateline signal ZCPL can be raised at 216 to a different third voltage level, which is greater than the second level, but need not be the same as the first voltage level. Furthermore, the methods of the invention may be employed in systems using pulse sensing or any other sensing technique, wherein the sense amp may be enabled after, or concurrently with the array plateline (e.g., PL1) being deactivated. Alternatively, the methods of the invention may be employed in systems using step sensing or any other sensing technique, wherein the sense amp may be enabled while the array plateline PL is activated and the ZCPL is at the second voltage or at a third voltage. All such variants are contemplated as falling within the scope of the invention and the appended claims. Moreover, the methods and devices of the invention find utility in single transistor-single capacitor (1T1C) circuits and other memory cell architectures (e.g., 2T2C, etc.), wherein the invention is not limited to the illustrated examples.

The method may also comprise coupling the first zero cancellation capacitor terminal to zero volts before coupling the first zero cancellation capacitor terminal to the bitline, for example, using the discharge transistor 136 of FIG. 3B above via a ZCRG signal from the control system 122. The invention could also be used in ferroelectric latches to read latch states, and also in non-volatile SRAM devices involving ferroelectric capacitors used to provide non-volatility to the SRAM. Although these or other circuits may use different terminology to describe various circuits elements for similar functions as described above for FeRAM arrays, nevertheless they fall within the scope of this invention. The words 0V, zero volts, Vss and ground are all inter-changeable.

Referring now to FIGS. 5A-7D, the present invention provides ferroelectric memory devices having an array of ferroelectric memory cells, along with one or more zero cancellation circuits, wherein the zero cancellation circuits may be constructed using some or all of the multilayer structural topology of the memory array cells, whereby the zero cancellation circuits are identical or substantially identical to the ferroelectric memory cells of the array. Several possible embodiments are hereinafter illustrated and described in the context of the exemplary device 102 using a folded bitline architecture of 1T1C memory cells 106, in which the cells 106 of ferroelectric memory array 104 and the zero cancellation system 130 are constructed in a multi-layer structure, wherein one or more layers of the zero cancellation circuits (e.g., circuits 130a and 130aB in FIG. 3B) are the same or substantially identical to those of the memory cells 106. In this regard, FIGS. 5A-5E illustrate a first embodiment in which the zero cancellation circuits 130 are provided without zero cancellation discharge switching devices, whereas FIGS. 6A-6E and 7A-7E illustrate second and third embodiments in which zero cancellation discharge switching devices 136 are included in the circuits 130.

In addition, the exemplary embodiments of FIGS. 5A-7D provide array cells 106 and zero cancellation circuits 130 that are constructed in a four-layer 'capacitor under bitline' structure where bitline contact structures pass through a capacitor layer for coupling cell transistors with bitline routings in interconnect layers formed above the capacitors. However, the invention is not limited to the specific cell types and architectures illustrated and described herein, wherein implementations using 1T-1C, 2T-2C, or other cell types and folded-bitline, open-bitline, chain-FRAM, and other array architecture types are contemplated as falling within the scope of the present invention and the appended claims.

Moreover, the exemplary embodiments of the semiconductor device are hereinafter illustrated with ferroelectric capacitors (memory cell capacitors and zero cancellation capacitors) formed in a dielectric layer (second layer) after front-end contact formation in a first transistor layer, where the capacitor layer is completed prior to formation of overlying interconnect (e.g., metalization) levels or layers. However, the various aspects of the invention may be employed in alternative embodiments, for example, wherein the ferroelectric capacitors, platelines, and bitline routing structures are individually formed at any level in a multi-level or multi-layer semiconductor device structure design. Furthermore, the invention may be employed in association with memory cell capacitors formed using any type of ferroelectric materials, with any type of zero cancellation capacitors (ferroelectric or other), and with any form of cell transistor and zero cancellation switching devices (e.g., MOS or other). In addition, the invention may be carried out in association with ferroelectric memory devices fabricated on or in any type of semiconductor body, including but not limited to silicon substrates or SOI wafers. In this regard, the invention is not limited to the examples illustrated and described herein, and all variant implementations are contemplated as falling within the scope of the present invention and the appended claims.

Figure 5A:
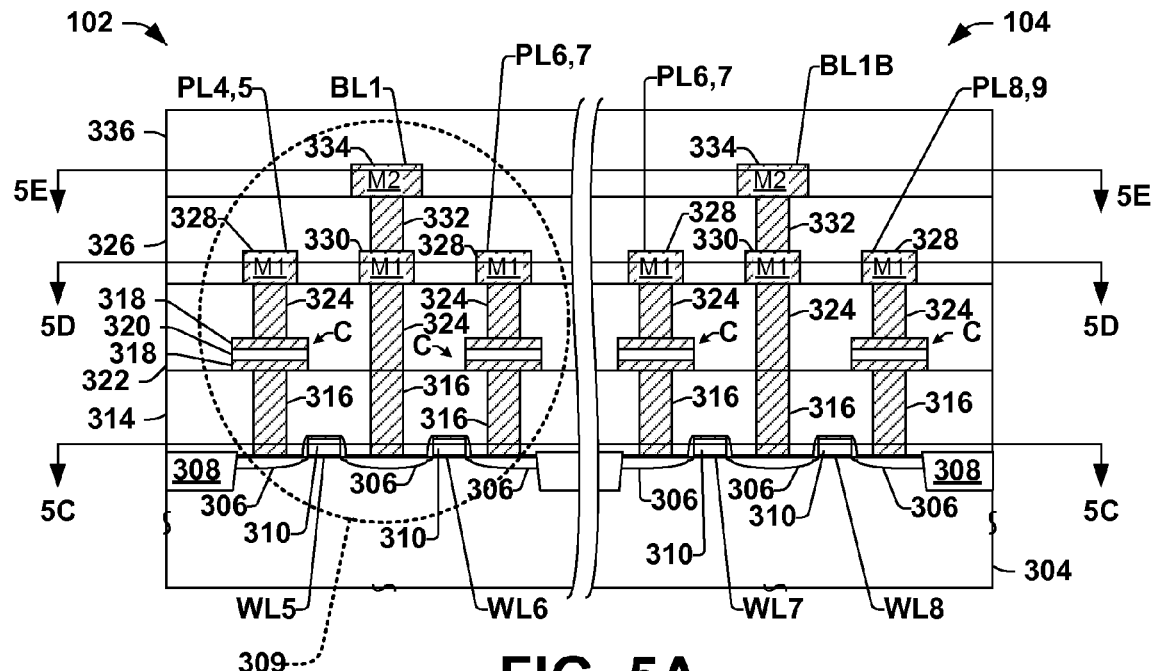
FIG. 5A is a partial side elevation view in section illustrating a portion of a capacitor under bitline layout of the memory cells in a first embodiment of the ferroelectric memory device of FIGS. 2A-3G.
Figure 5B:
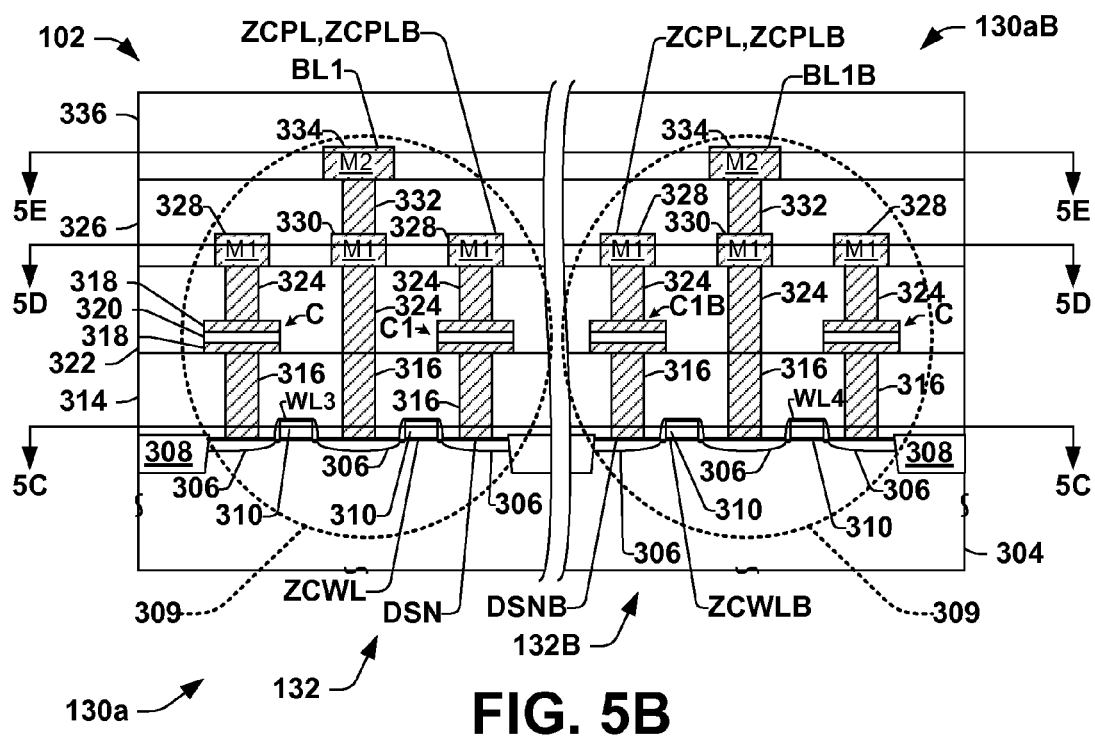
FIG. 5B is another partial side elevation view in section illustrating a portion of an exemplary zero cancellation system of the invention in the first embodiment of the ferroelectric memory device of FIGS. 2A-3G.

In a first embodiment of the invention, FIGS. 5A-5E illustrate a portion of the exemplary ferroelectric memory device 102 of FIGS. 2A-3G above. FIGS. 5A and 5B are partial sectional side elevation views and FIGS. 5C-5E are partial sectional top plan views, wherein the views of FIGS. 5A and 5B are taken along lines 5A-5A and 5B-5B, respectively, in FIGS. 5C-5E and the views of FIGS. 5C, 5D, and 5E are taken along lines 5C-5C, 5D-5D, and 5E-5E, respectively, in FIGS. 5A and 5B. In particular, FIG. 5A illustrates a portion of a capacitor under bitline layout of several exemplary ferroelectric memory cells 106 of the array 104 in the device 102 (shown in the top portions of FIGS. 5C-5E) and FIG. 5B illustrates a portion of an exemplary zero cancellation system 130 in one or more rows formed near the memory array 104 (bottom portions of FIGS. 5C-5E).

As illustrated in FIGS. 5A and 5B, the device 102 is constructed as a multi-layer structure with a first layer shown in FIG. 5C, second and third layers shown in FIG. 5D, and a fourth layer shown in FIG. 5E. The first layer (FIGS. 5A, 5B, and 5C) comprises the cell transistors 110 and the zero cancellation switching devices 132 (schematically illustrated in FIG. 3B above) formed on or in a semiconductor body 304, with array wordlines (wordlines WL5-WL8 shown in FIGS. 5A and 5C) extending along rows of ferroelectric memory cells 106 and zero cancellation wordlines ZCWL and ZCWLB extending along the row of zero cancellation circuits (FIGS. 3B, 5B, and 5C). The second layer FIGS. 5A, 5B, and 5D is formed above the first layer and includes the ferroelectric cell capacitors $C_{FE}$ (indicated simply as "C" in FIGS. 5A and 5D) and the zero cancellation capacitors C1 and C1B (FIGS. 3B, 5B, and 5D). The third layer (also in FIGS. 5A, 5B, and 5D) includes a first metalization level (M1) in which the array platelines and zero cancellation platelines are routed, and the fourth layer (FIGS. 5A, 5B, and 5E) comprises a second metalization level (M2) with the array bitlines BL1 and BL1B, wherein at least one layer of the individual zero cancellation circuits 130 is identical to that of the individual ferroelectric memory cells 106.

As shown in FIGS. 5A-5E, the memory device 102 is fabricated using a silicon substrate or SOI wafer 304 in which transistor source/drains 306 are formed in active regions 312 (FIG. 5C) separated by isolation structures 308 (FIGS. 5A and 5B), wherein transistor gate structures 310 are formed over channel regions of the substrate 304 as part of polysilicon array wordlines and zero cancellation wordline structures. MOS type cell transistors 110 are thus formed by the gates 310 and the source/drains 306 in the first layer, wherein the source/drains 306 are formed by doping portions of the active regions 312 in the substrate (FIGS. 5A and 5B), and wherein the source/drains 306 that are coupled with the array bitline structures BL1, BL1B are shared between adjacent transistors 110 in the array 104 and in the first embodiment of the zero cancellation system 130. Also in the first layer, a first interlevel or interlayer dielectric material 314 is formed (e.g., alternatively referred to as a pre-metal dielectric or PMD) over the transistors and the substrate 304, through which conductive contacts 316 are formed for interconnection of the transistor gate and source/drain terminals 310 and 306, respectively with other layers formed above the PMD material 314.

In the second layer (FIGS. 5A, 5B, and 5D), ferroelectric cell capacitors C are formed over the PMD material 314, including upper and lower conductive electrodes or plates 318 and a ferroelectric material 320 between the electrodes 318 to form the ferroelectric cell capacitors of the memory array 104 (FIG. 5A and the upper portion of FIG. 5D) and the zero cancellation capacitors C1 and C1B (FIG. 5B and the lower portion of FIG. 5D). As illustrated in FIGS. 5A and 5C, a second ILD dielectric material 322 is formed over the ferroelectric capacitors C and the first dielectric 314 of the second layer, and conductive via structures 324 are formed through the ILD dielectric 322 to couple with the upper capacitor electrodes 318 and the contacts 316 of the second layer. The third layer is formed over the capacitor layer, including another ILD dielectric material 326 formed over the dielectric 322, and a first set of metal interconnect structures (M1) are formed therein, including conductive array and zero cancellation plateline routing structures 328 and landing pads 330 for the bitline connections passing through the third layer. Bitline connection vias 332 are formed through the third layer dielectric 326 to connect the landing pads 330 with bitline structures 334 (e.g., for the illustrated bitlines BL1 and BL1B) in a fourth structure layer (e.g., a second metalization level M2) in yet another ILD dielectric material 336 (FIGS. 5A, 5B, and 5E).

In the first embodiment of FIGS. 5A-5E, the ferroelectric memory cell topology (FIG. 5A) of the first four layers in the array 104 is essentially replicated as another row to form the zero cancellation system 130 (FIG. 5B) having no zero cancellation discharge switching devices 136, wherein individual zero cancellation circuits 130a, 130aB are provided for each array bitline, wherein the zero cancellation circuits 130a, 130aB are identical to individual ferroelectric memory cells 106, with similar or identical capacitors C1, C1B and transistors 132, 132B. Other alternate implementations of the first embodiment are possible within the scope of the invention, for example, wherein the zero cancellation capacitors C1, C1B may be larger or smaller than the memory cell capacitors $C_{FE}$, the zero cancellation switching devices 132, 132B are of different type or size from that of the memory cell access transistors 110, and/or where the zero cancellation circuits 130a, 130aB are of different but substantially identical dimensions (e.g., height along the bitline direction and/or width along the wordline or row direction), wherein all such variant implementations are contemplated as falling within the scope of the invention and the appended claims. However, the identity or substantial identity of one or more layers and/or dimensions of the zero cancellation circuits 130 and the memory cells 106 provides advantages with respect to minimizing the need for dummy or edge cells (e.g., or wasted space) between the array 104 and the zero cancellation system 130 and avoiding adding complexity to the Optical Proximity Correction (OPC) for the device layers, without significantly impacting the memory cells 106 in the array rows nearest the zero cancellation circuits 130. In this regard, the zero cancellation circuits 130 and the individual memory cells 106 are identical in the first embodiment of FIGS. 5A-5E.

Moreover, as illustrated in FIG. 5A and the upper portions of FIGS. 5C-5E, pairs of adjacent ferroelectric memory cells 106 along a given column may be seen as forming a memory super cell structure 309 comprising a single active region 312 with two gates 310 along adjacent wordlines, a shared source/drain 306 between the gate 310 that is coupled with a bitline in the fourth layer, and with two ferroelectric capacitors C in the second layer having bottom electrodes 318 coupled with two outer (e.g., non-shared) source/drains 306 and top electrodes 318 coupled with platelines in the third layer. In the left half of FIG. 5A, for example, one such super cell 309 is illustrated, comprising two cells 106 with cell transistors 110 formed in a single first layer active region 312 along the first bitline BL1 column in adjacent rows (wordlines WL5 and WL6), wherein the shared source/drain 306 between the wordline gates WL5 and WL6 is coupled with bitline BL1 in the fourth layer, and wherein ferroelectric cell capacitors C are coupled between the non-shared transistor source/drains 306 and the platelines PL4,5 and PL6,7 in the third layer.

According to another aspect of the invention, the zero cancellation circuits 130a and 130aB individually comprise a zero cancellation super cell structure that is similar or identical to one or more of the memory super cell structures 309 of the memory cells 106. In the first embodiment, for example, the zero cancellation super cell structures 309 (FIG. 5B) are identical to the memory super cell structure 309 (FIG. 5A) of the memory cells 106. Referring particularly to the left half of FIG. 5B, the first illustrated zero cancellation super cell structure 309 comprises the zero cancellation wordline ZCWL (gate 310 of the zero cancellation switching device 132), with the zero cancellation capacitor C1 in the second layer coupled between the corresponding outer source/drain 306 in the first layer and the zero cancellation plateline ZCPL/ZCPLB in the third layer, and with the shared source drain 306 in the first layer being coupled with the array bitline BL1 in the fourth layer. Similarly, the complementary zero cancellation circuit 130aB (illustrated in the right half of FIG. 5B) comprises a zero cancellation super cell structure 309 that is identical to one memory super cell structure 309 of the memory cells 106. In this example, the zero cancellation super cell structure 309 comprises the zero cancellation wordline ZCWLB gate 310, with the zero cancellation capacitor C1B in the second layer coupled between the corresponding outer source/drain 306 in the first layer and the zero cancellation plateline ZCPL/ZC-PLB in the third layer, where the shared source drain 306 in the first layer of this super cell 309 is coupled with the complementary array bitline BL1B in the fourth layer.

According to yet another aspect of the invention, the zero cancellation circuits 130a, 130aB may comprise zero cancellation discharge switching devices 136, 136B (FIG. 3B) for selectively coupling the zero cancellation capacitors C1, C1B to Vss (e.g., at zero cancellation circuit storage nodes DSN and DSNB in the system 130) according to control signals ZCRG, ZCRGB, respectively. FIGS. 6A-7E below illustrate two exemplary embodiments of the zero cancellation system 130 with the zero cancellation discharge switching devices 136 and 136B being provided in the zero cancellation circuits 130a and 130aB, respectively.

Figure 6A:
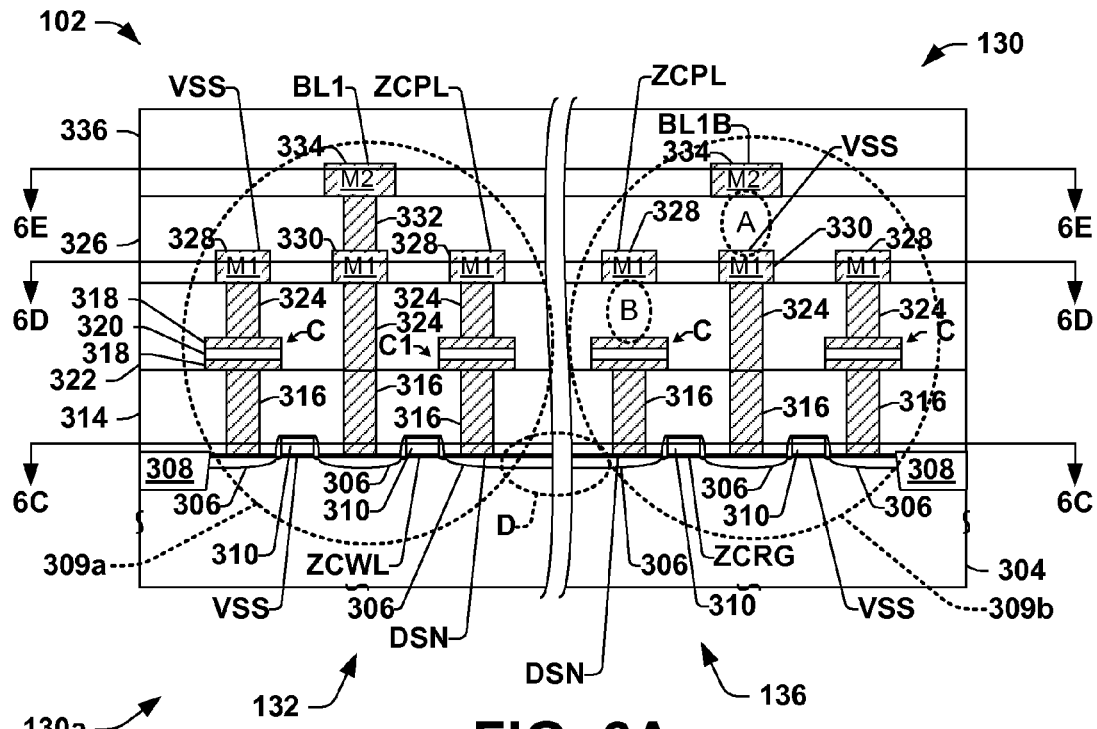
FIG. 6A is a partial side elevation view in section illustrating a portion of another exemplary zero cancellation system of the invention in a second embodiment of the ferroelectric memory device of FIGS. 2A-3G.
Figure 6B:
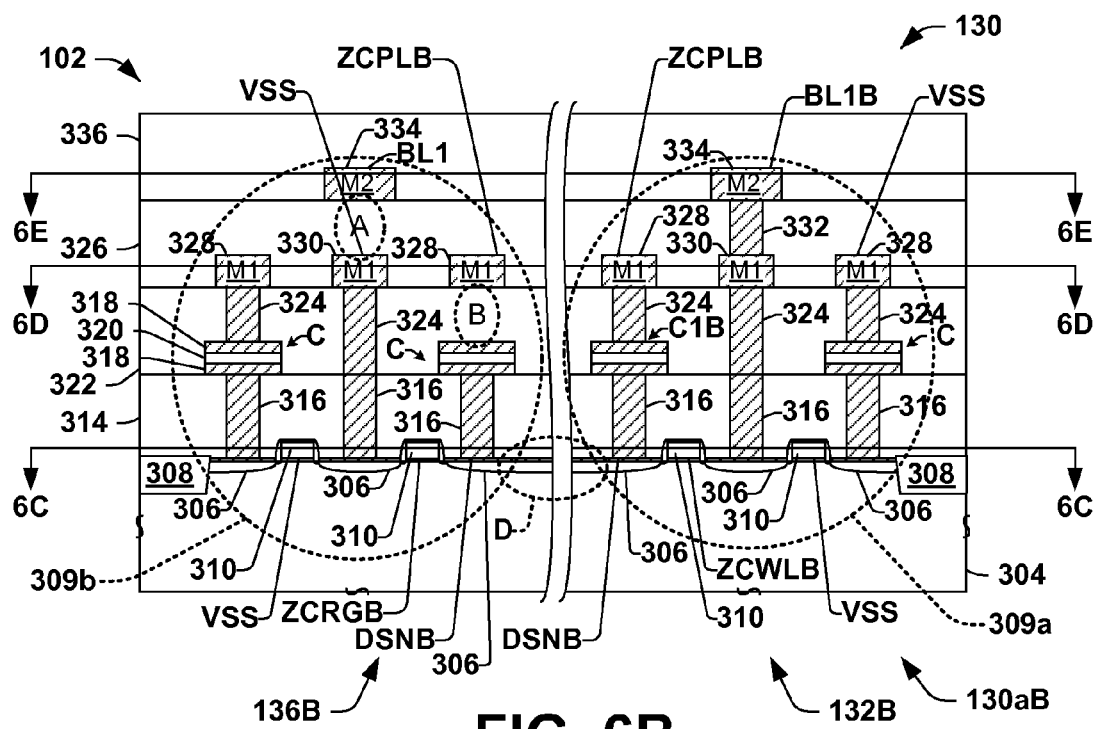
FIG. 6B is a partial side elevation view in section illustrating another portion of the zero cancellation system in the second embodiment of the ferroelectric memory device of FIGS. 2A-3G.

A second embodiment is illustrated in FIGS. 6A-6E, wherein the zero cancellation circuits 130a and 130aB individually comprise a zero cancellation super cell structure that is substantially identical to two memory super cell structures 309 (e.g., only a few minor modifications thereto). In the second embodiment, the device 102 is again constructed as a multi-layer structure with a first layer shown in FIG. 6C, second and third layers shown in FIG. 6D, and a third layer shown in FIG. 6E, wherein the memory cells 106 of the array 104 are constructed as illustrated in FIG. 5A above (as well as in the upper portions of FIGS. 6C-6E), and wherein the layers 1-4 are generally as described above with certain differences noted below. In this example, the first zero cancellation circuit 130a (FIG. 6A) is coupled with the bitline BL1, and comprises two super cells 309a and 309b that form a zero cancellation super cell structure that is substantially identical to two memory super cell structures 309. Similar complementary structures 309a and 309b are used in forming the second illustrated zero cancellation circuit 130aB as illustrated in FIG. 6B.

In the circuit 130a of FIG. 6A, the zero cancellation super cell 309a is essentially the same as (e.g., identical to) the memory super cell structure 309 (FIG. 5A), comprising the switching device 132 with a gate 310 formed by the zero cancellation wordline ZCWL in the first layer, the zero cancellation capacitor C1 in the second layer coupled between the corresponding outer source/drain 306 in the first layer and the zero cancellation plateline ZCPL in the third layer, wherein the shared source drain 306 in the first layer is coupled with the array bitline BL1 in the fourth layer.

In the second embodiment, moreover, the zero cancellation circuit 130a further comprises the zero cancellation discharge switching device 136 (schematically illustrated in FIG. 3B) formed in the second super cell 309b (shown in the right half of FIG. 6A). The super cell 309b is substantially identical to the memory super cells 309, with a few minor alterations. One difference is that the bitline connection of the modified super cell 309b is omitted in the third layer, indicated as a dashed circle location "A" in FIGS. 6A and 6E, and the corresponding third layer landing pad structure of the memory super cell is replaced by a first metal level (M1) routing 330 for the pre-determined voltage level (Vss) to which the zero cancellation capacitor C1 is coupled by the switching device 136 (labeled VSS in FIG. 6D). Other equivalent modifications could be done to couple the shared source/drain in the super cell 309b to Vss or other pre-determined voltage level instead of to the associated bitline BL1B.

In addition, the super cell 309b of FIG. 6A is modified by disconnecting the ferroelectric capacitor C associated with the discharge switching device 136, which is accomplished in the illustrated example by removal of the contact 324 in the second layer between the upper capacitor electrode 318 and the first metalization level M1, as indicated by a dashed circle location "B" in FIGS. 6A and 6D. In one possible alternate implementation, any of the structures overlying this outer source/drain 306 may be omitted, such as the lower electrode contact 316 in the first layer, the M1 structure 328, and/or the capacitor C itself, in the super cell 309b.

A third alteration to the memory super cell structure 309b to form the circuit 130a is the coupling of the outer source/drains 306 at the zero cancellation circuit storage node DSN, by joining the active regions 312, as indicated by a dashed circle location "D" in FIGS. 6B and 6C. Since the source/drains 306 of the two switching devices 132 and 136 are thus joined, one possible alternative to the illustrated implementation of the second embodiment is to instead use the ferroelectric capacitor C of the super cell 309b as the zero cancellation capacitor C1, with a contact formed at location "B" in FIGS. 6A and 6D), with the capacitor in the super cell 309a instead being disconnected from one or both of the storage node DSN and/or the zero cancellation plateline ZCPL or omitted altogether.

The complementary zero cancellation circuit 130aB of FIG. 6B comprises a similar construction to that of the circuit 130a using super cell structures 309a and 309b, wherein the zero cancellation switching device 132B and the zero cancellation capacitor C1B are constructed using a super cell 309a coupled to the bitline BL1B, with the third layer bitline contact being removed from the super cell 309b at location "A" (FIGS. 6B and 6E), the second layer capacitor contact being removed therefrom at location "B" (FIGS. 6B and 6D), the third layer landing pad structure above the shared source/drain 306 being replaced with a Vss routing structure 330 (in the M1 metalization level, as in FIGS. 6B and 6D), and with the storage node source/drains 306 at node DSNB being coupled by joining the active regions 312 of the super cells 309a and 309b at location "D" in FIGS. 6B and 6C.

In this manner, the zero cancellation circuits 130a and 130aB individually comprise a zero cancellation super cell structure that is substantially identical to two memory super cell structures 309 in the second embodiment of FIGS. 6A-6E. As with the first embodiment of FIGS. 5A-5E above, the second embodiment of FIGS. 6A-6E advantageously provides the zero cancellation circuits 130a, 130aB structured essentially as additional rows to the memory array 104 with identity or substantial identity of one or more layers and/or dimensions of the zero cancellation circuits 130 relative to that of the memory cells 106. As a result, the layout techniques of the invention may be employed to provide the advantages of the zero cancellation concept while mitigating the need for dummy cells or wasted space between the array 104 and the zero cancellation system 130 and also avoiding unnecessary complication of OPC for the layers of the device 102, and without significantly impacting the memory cells 106 in the array rows nearest the zero cancellation system 130.

Figure 7A:
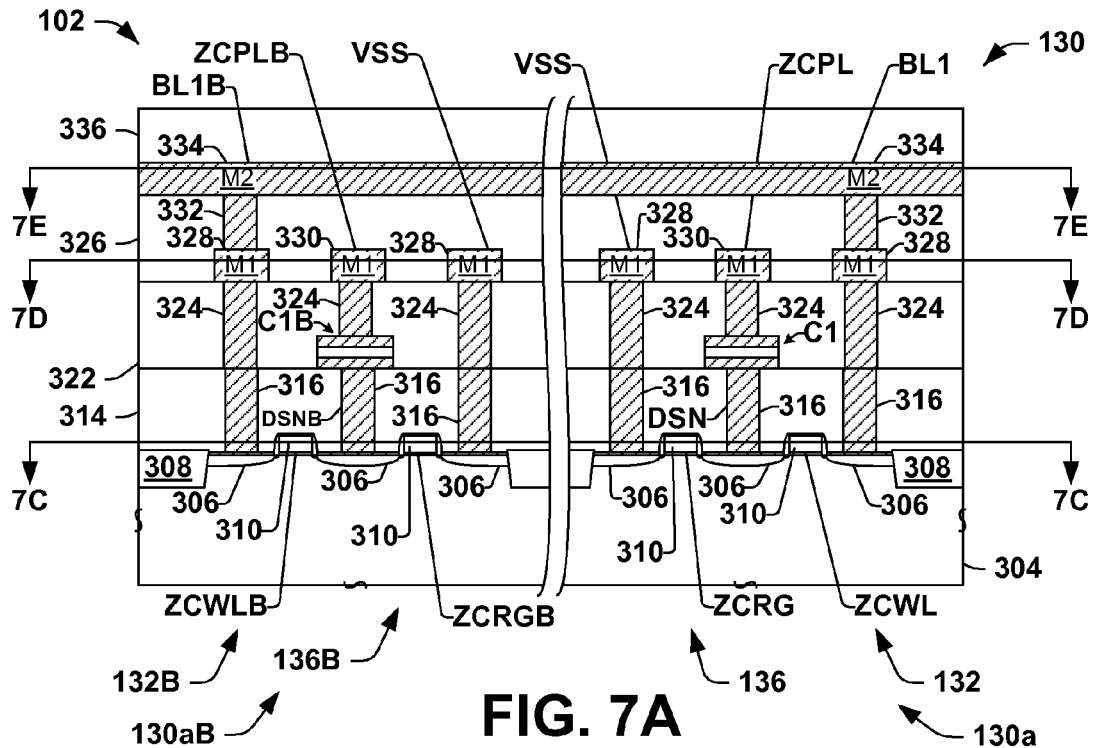
FIG. 7A is a partial side elevation view in section illustrating a portion of a capacitor under bitline layout of the memory cells in a third embodiment of the ferroelectric memory device of FIGS. 2A-3G.
Figure 7B:
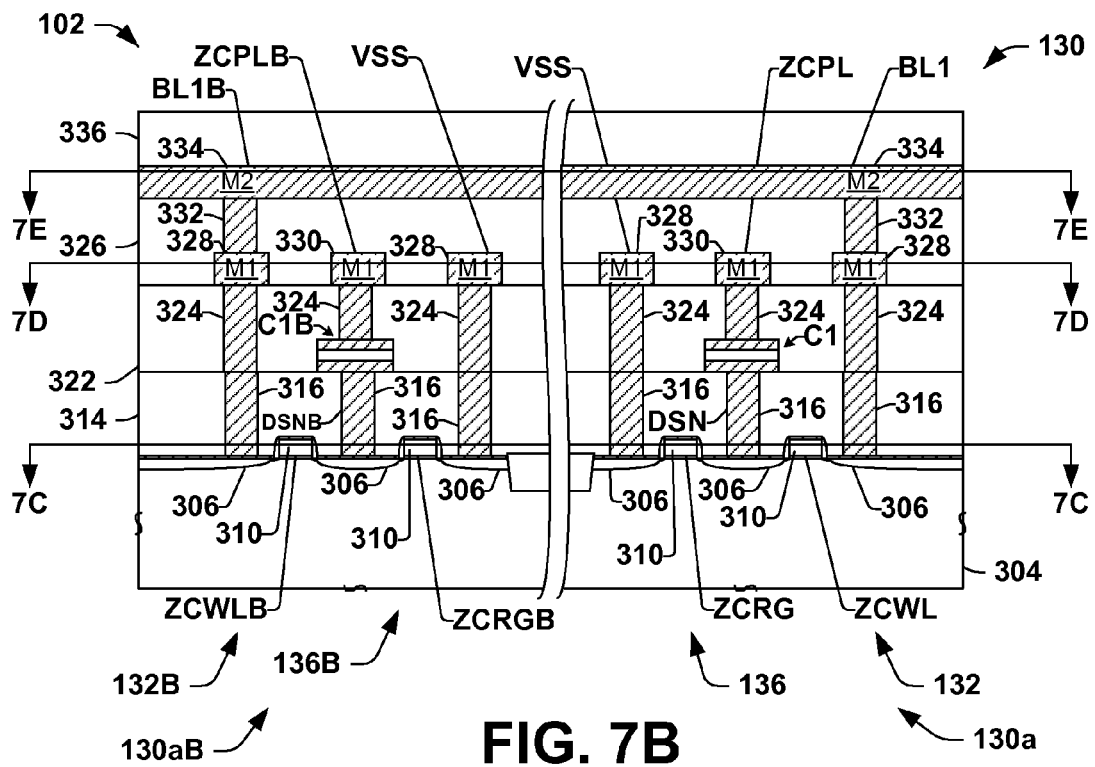
FIG. 7B is another partial side elevation view in section illustrating a portion of an zero cancellation system of the invention in the third embodiment of the ferroelectric memory device of FIGS. 2A-3G.

A third embodiment is illustrated in FIGS. 7A-7E, which includes the complementary zero cancellation circuits 130a and 130aB (schematically shown in FIG. 3B above) individually comprising a zero cancellation capacitor C1/C1B, a zero cancellation switching device 132/132A, and a zero cancellation discharge switching device 136/136A, which occupies approximately half the area as was the case in the second embodiment of FIGS. 6A-6E above. In this embodiment, the memory cells 106 of the array are configured generally as illustrated in FIG. 7A above, wherein FIG. 7B illustrates a portion of the zero cancellation system 130 of the invention, and FIGS. 7C, 7D, and 7E are partial top views of the exemplary device 102 taken along lines 7C-7C, 7D-7D, and 7E-7E, respectively, of 7A-7A and 7B-7B in the FIGS. 7A and 7B, respectively. In this embodiment, the zero cancellation circuits 130a and 130aB (309d) can be viewed as modified memory super cell structures 309c, where some through contacts are removed and metal routing may be different. Also when a zero cancellation cell is placed with the array cells, it forms a large active region marked "G" in FIG. 7C, which spans across three (3) gates. Thus, as seen in the right half of FIG. 7B (zero cancellation circuit 130a), the zero cancellation capacitor C1 is provided above the shared source/drain. The bitline contacts for the array cells in FIG. 7C for WL6 and WL5 are shared with that of the zero cancellation circuits.

As illustrated in FIGS. 7A-7E, in the third embodiment both transistors associated with the active regions 312a are employed, where one transistor is the zero cancellation switching device 132 and the other transistor is the zero cancellation discharge switching device 136, wherein the shared source drain 306 of the active region 312a forms the zero cancellation storage node DSN that is coupled to the first zero cancellation capacitor C1, with the upper capacitor terminal 318 being coupled to the zero cancellation plate line ZCPL or ZCPLB. In this fashion, as in the first and second embodiments above, one or more of the multi-layer structure layers are substantially identical in the zero cancellation system 130 and the memory array 104, thereby mitigating the need for dummy cells or wasted space between the array 104 and the zero cancellation system 130 and also avoiding or minimizing unnecessary complication of OPC for the layers of the device 102, and without significantly impacting the memory cells 106 in the array rows nearest the zero cancellation system 130, and while occupying less space than the second embodiment of FIGS. 6A-6E.

The zero cancellation cell rows can be embedded inside the cell array as shown in the FIG. 5B wherein they are inserted in between wordline rows WL3 and WL4. In FIGS. 6A-6E they are inserted between WL4 and WL5. In FIGS. 7A-7E they are inserted between WL5 and WL6. In one embodiment, in order to minimize OPC issues the cells in the bottom of FIGS. 7C-7E for the rows WL5 and below are shifted by a half column compared to the cells in the array without zero cancellation circuit in the top of FIGS. 7C-7E. In alternative embodiments, the extra zero cancellation cell rows could also be placed at the edge of the cell array, e.g., besides WL0 or the wordline representing the highest wordline number or any other suitable location. If the zero cancellation circuit of the FIGS. 7A-7E is placed at the edge of the array, e.g., beside WL0 or the wordline representing the highest wordline, no cell in the array would need to be shifted. In general there could be some dummy rows between the zero cancellation cell rows and the array cell rows or there could be some space between the two in another embodiment. The zero cancellation rows need not be placed together. For example, they could be split into several rows and inserted at different places in the cell array. All these variations fall within the scope of the invention.

Although the invention has been illustrated and described with respect to one or more implementations, alterations and/or modifications may be made to the illustrated examples without departing from the spirit and scope of the appended claims. In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising".

What is claimed is:
1. A ferroelectric memory device, comprising:
an array of ferroelectric memory cells arranged in rows along a wordline direction and columns along a bitline direction, the ferroelectric memory cells individually comprising a ferroelectric cell capacitor having first and second terminals and a cell transistor adapted to selectively couple the first cell capacitor terminal to an array bitline associated with an array column according to an array wordline, wherein rows of the memory cells are coupled with a corresponding array wordline and a corresponding array plateline;
a zero cancellation circuit coupled with an array bitline, the zero cancellation circuit comprising a zero cancellation capacitor having first and second terminals, and a zero cancellation switching device coupled with the zero cancellation capacitor, the zero cancellation switching device selectively coupling the first zero cancellation capacitor terminal with the array bitline according to a zero cancellation wordline signal; and
a control system coupled with the zero cancellation circuit, the control system providing the zero cancellation wordline signal to the zero cancellation switching device and providing a negative zero cancellation plateline pulse of a pre-determined magnitude to the second zero cancellation capacitor terminal while a cell plateline signal is activated to provide a voltage across a target ferroelectric cell capacitor;
wherein the zero cancellation circuit is substantially identical to the individual ferroelectric memory cells, and
wherein the ferroelectric memory cells and the zero cancellation circuit are formed in a multi-layer structure with conductive contacts formed between layers, and wherein at least one layer of the zero cancellation circuit is identical to that of the individual ferroelectric memory cells.

2. The ferroelectric memory device of claim 1, wherein the zero cancellation circuit is identical to the individual ferroelectric memory cells.

3. The ferroelectric memory device of claim 1, wherein the zero cancellation switching device is substantially identical to the individual cell transistors.

4. The ferroelectric memory device of claim 1, wherein the zero cancellation capacitor is identical to the individual ferroelectric cell capacitors.

5. The ferroelectric memory device of claim 1, wherein a width dimension of the zero cancellation circuit along the wordline direction is identical to that of the individual ferroelectric memory cells.

6. The ferroelectric memory device of claim 1, wherein a height dimension of the zero cancellation circuit along the bitline direction is identical to that of the individual ferroelectric memory cells.

7. The ferroelectric memory device of claim 1, wherein the array of ferroelectric memory cells is a folded bitline array.

8. The ferroelectric memory device of claim 1, wherein the individual ferroelectric memory cells are single-transistor, single capacitor cells.

9. The ferroelectric memory device of claim 1, comprising a row of zero cancellation circuits coupled with individual array bitlines to form a zero cancellation system, the individual zero cancellation circuits comprising a zero cancellation capacitor having first and second terminals, and a zero cancellation switching device coupled with the zero cancellation capacitor, the zero cancellation switching device selectively coupling the first zero cancellation capacitor terminal with a corresponding array bitline according to the zero cancellation wordline signal, wherein the individual zero cancellation circuits are substantially identical to the individual ferroelectric memory cells.

10. A ferroelectric memory device, comprising:
an array of ferroelectric memory cells arranged in rows along a wordline direction and columns along a bitline direction, the ferroelectric memory cells individually comprising a ferroelectric cell capacitor having first and second terminals and a cell transistor adapted to selectively couple the first cell capacitor terminal to an array bitline associated with an array column according to an array wordline, wherein rows of the memory cells are coupled with a corresponding array wordline and a corresponding array plateline;
a zero cancellation circuit coupled with an array bitline, the zero cancellation circuit comprising a zero cancellation capacitor having first and second terminals, and a zero cancellation switching device coupled with the zero cancellation capacitor, the zero cancellation switching device selectively coupling the first zero cancellation capacitor terminal with the array bitline according to a zero cancellation wordline signal; and
a control system coupled with the zero cancellation circuit, the control system providing the zero cancellation wordline signal to the zero cancellation switching device and providing a negative zero cancellation plateline pulse of a pre-determined magnitude to the second zero cancellation capacitor terminal while a cell plateline signal is activated to provide a voltage across a target ferroelectric cell capacitor; wherein the zero cancellation circuit is substantially identical to the individual ferroelectric memory cells, wherein the ferroelectric memory cells and the zero cancellation circuits are formed in a multilayer structure with conductive contacts formed between layers, the multi-layer structure comprising:
a first layer comprising the cell transistors and the zero cancellation switching devices formed on or in a semiconductor body, with array wordlines extending along rows of ferroelectric memory cells and a zero cancellation wordline extending along the row of zero cancellation circuits;
a second layer formed above the first layer, the second layer comprising the ferroelectric cell capacitors and the zero cancellation capacitors;
a third layer formed above the second layer, the third layer comprising array platelines extending along rows of ferroelectric memory cells and a zero cancellation plateline extending along the row of zero cancellation circuits; and
a fourth layer formed above the third layer, the fourth layer comprising array bitlines extending along columns of ferroelectric memory cells and zero cancellation circuits along the bitline direction;
wherein at least one layer of the individual zero cancellation circuits is substantially identical to that of the individual ferroelectric memory cells.

11. The ferroelectric memory device of claim 10, wherein the first, second, third, and fourth layers of the zero cancellation circuits are identical to the first, second, third, and fourth layers of the individual ferroelectric memory cells.

12. The ferroelectric memory device of claim 10, wherein the individual zero cancellation circuits further comprise a zero cancellation discharge switching device coupled with the zero cancellation capacitor, the zero cancellation discharge switching device selectively coupling the first zero cancellation capacitor terminal to a pre-determined voltage level according to a zero cancellation discharge wordline signal from the control system.

13. The ferroelectric memory device of claim 12, wherein the individual cell transistors comprise a first source/drain in the first layer that is coupled with the first cell capacitor terminal in the second layer, and a second source/drain in the first layer that is coupled with a bitline in the fourth layer by bitline contacts in the first and third layers;
wherein the individual zero cancellation circuits comprise a zero cancellation switching device having a first source/drain in the first layer that is coupled with the first zero cancellation capacitor terminal, and a second source/drain in the first layer that is coupled with a bitline in the fourth layer by bitline contacts in the first and third layers; and
wherein the individual zero cancellation discharge switching devices comprise a first source/drain in the first layer that is coupled with the first zero cancellation capacitor terminal, and a second source/drain in the first layer that is coupled with the pre-determined voltage level.

14. The ferroelectric memory device of claim 13, wherein active regions of the individual zero cancellation switching devices and the corresponding individual zero cancellation discharge switching devices are joined to couple the first source/drain of the individual zero cancellation switching devices with the first source/drain of the corresponding individual zero cancellation discharge switching devices, and wherein the second source/drain of the individual zero cancellation discharge switching devices is not coupled to the fourth layer.

15. The ferroelectric memory device of claim 14, wherein the individual zero cancellation discharge circuits further comprise a ferroelectric zero cancellation discharge capacitor formed above the first source/drain of the zero cancellation discharge switching device, and wherein the zero cancellation discharge capacitor is coupled to only one of the first source/drain of the zero cancellation discharge switching device and the second zero cancellation capacitor terminal.

16. The ferroelectric memory device of claim 14, wherein the individual zero cancellation discharge circuits further comprise a ferroelectric zero cancellation discharge capacitor formed above the first source/drain of the zero cancellation discharge switching device, and wherein the zero cancellation discharge capacitor is not coupled to the first source/drain of the zero cancellation discharge switching device or the second zero cancellation capacitor terminal.

17. The ferroelectric memory device of claim 13, wherein the individual zero cancellation discharge circuits further comprise a ferroelectric zero cancellation discharge capacitor formed above the first source/drain of the zero cancellation discharge switching device, and wherein the zero cancellation discharge capacitor is coupled to only one of the first source/drain of the zero cancellation discharge switching device and the second zero cancellation capacitor terminal.

18. The ferroelectric memory device of claim 13, wherein the individual zero cancellation discharge circuits further comprise a ferroelectric zero cancellation discharge capacitor formed above the first source/drain of the zero cancellation discharge switching device, and wherein the zero cancellation discharge capacitor is not coupled to the first source/drain of the zero cancellation discharge switching device or the second zero cancellation capacitor terminal.

19. A ferroelectric memory device, comprising:
an array of ferroelectric memory cells arranged in rows along a wordline direction and columns along a bitline direction, the ferroelectric memory cells individually comprising a ferroelectric cell capacitor having first and second terminals and a cell transistor adapted to selectively couple the first cell capacitor terminal to one of a pair of array bitlines associated with an array column according to an array wordline, wherein rows of the memory cells are coupled with a corresponding array wordline and a corresponding array plateline;
a zero cancellation system comprising zero cancellation circuits coupled with individual array bitlines, the individual zero cancellation circuits comprising:
a zero cancellation capacitor having first and second terminals;
a zero cancellation switching device coupled with the zero cancellation capacitor, the zero cancellation switching device selectively coupling the first zero cancellation capacitor terminal with a corresponding array bitline according to the zero cancellation wordline signal; and
a zero cancellation discharge switching device coupled with the zero cancellation capacitor, the zero cancellation discharge switching device selectively coupling the first zero cancellation capacitor terminal to a pre-determined voltage level according to a zero cancellation discharge wordline signal from the control system;
a control system coupled with the zero cancellation circuit, the control system providing the zero cancellation wordline signal and the zero cancellation discharge wordline signal to the zero cancellation switching system and providing a negative zero cancellation plateline pulse of a pre-determined magnitude to the second zero cancellation capacitor terminals while a cell plateline signal is activated to provide a voltage across a target ferroelectric cell capacitor;
wherein the ferroelectric memory cells and the zero cancellation circuits are formed in a multi-layer structure with conductive contacts formed between layers, the multi-layer structure comprising:
a first layer comprising the cell transistors, the zero cancellation switching devices, and the zero cancellation discharge switching devices formed on or in a semiconductor body, with array wordlines extending along rows of ferroelectric memory cells, a zero cancellation wordline extending along the zero cancellation circuits, and a zero cancellation discharge wordline extending along the zero cancellation circuits;
a second layer formed above the first layer, the second layer comprising the ferroelectric cell capacitors and the zero cancellation capacitors;
a third layer formed above the second layer, the third layer comprising array platelines extending along rows of ferroelectric memory cells and a zero cancellation plateline extending along the zero cancellation circuits; and
a fourth layer formed above the third layer, the fourth layer comprising array bitlines extending along columns of ferroelectric memory cells and zero cancellation circuits along the bitline direction;
wherein the individual zero cancellation switching devices comprise:
a zero cancellation switching device gate in the first layer that is coupled with the zero cancellation wordline in the first layer,
a first source/drain in the first layer that is coupled with the first zero cancellation capacitor terminal, and
a second source/drain in the first layer that is coupled with an array bitline in the fourth layer by bitline contacts in the first and third layers;
wherein the individual zero cancellation discharge switching devices comprise:
a zero cancellation discharge switching device gate in the first layer that is coupled with the zero cancellation discharge wordline,
a first source/drain in the first layer that is coupled with the first zero cancellation capacitor terminal, and
a second source/drain in the first layer that is coupled with the pre-determined voltage level;
wherein the second zero cancellation capacitor terminal is coupled with the zero cancellation plateline in the third layer; and
wherein the first source/drain of the individual zero cancellation switching devices and the first source/drain of the individual corresponding zero cancellation discharge switching devices form a shared source/drain between the zero cancellation switching device gate and the a zero cancellation discharge switching device gate that is coupled with the first zero cancellation capacitor terminal.

20. The ferroelectric memory device of claim 19, wherein at least one layer of the zero cancellation circuit is identical to that of the individual ferroelectric memory cells.

21. The ferroelectric memory device of claim 19, wherein at least one layer of the zero cancellation circuit is substantially identical to that of the individual ferroelectric memory cells.

22. The ferroelectric memory device of claim 19, wherein the array of ferroelectric memory cells is a folded bitline array.

23. The ferroelectric memory device of claim 19, wherein the individual ferroelectric memory cells are single-transistor, single capacitor cells.

24. A ferroelectric memory device, comprising:
an array of ferroelectric memory cells arranged in rows along a wordline direction and columns along a bitline direction, the ferroelectric memory cells individually comprising a ferroelectric cell capacitor having first and second terminals and a cell transistor adapted to selectively couple the first cell capacitor terminal to one of a pair of array bitlines associated with an array column according to an array wordline, wherein rows of the memory cells are coupled with a corresponding array wordline and a corresponding array plateline;

a row of zero cancellation circuits individually coupled with an array bitline, the zero cancellation circuits individually comprising a zero cancellation capacitor having first and second terminals, and a zero cancellation switching device coupled with the zero cancellation capacitor, the zero cancellation switching device selectively coupling the first zero cancellation capacitor terminal with the array bitline according to a zero cancellation wordline signal; and a control system coupled with the zero cancellation circuits, the control system providing the zero cancellation wordline signal to the zero cancellation switching devices and providing a negative zero cancellation plateline pulse of a pre-determined magnitude to the second zero cancellation capacitor terminals while a cell plateline signal is activated to provide a voltage across a target ferroelectric cell capacitor;

wherein the ferroelectric memory cells and the zero cancellation circuits are formed in a multi-layer structure with conductive contacts formed between layers, the multi-layer structure comprising:

a first layer comprising the cell transistors and the zero cancellation switching devices formed on or in a semiconductor body, with array wordlines extending along rows of ferroelectric memory cells and a zero cancellation wordline extending along the row of zero cancellation circuits;

a second layer formed above the first layer, the second layer comprising the ferroelectric cell capacitors and the zero cancellation capacitors;

a third layer formed above the second layer, the third layer comprising array platelines extending along rows of ferroelectric memory cells and a zero cancellation plateline extending along the row of zero cancellation circuits; and a fourth layer formed above the third layer, the fourth layer comprising array bitlines extending along columns of ferroelectric memory cells and zero cancellation circuits along the bitline direction;

wherein pairs of adjacent ferroelectric memory cells along a given column form a memory super cell structure comprising a single active region with two gates along adjacent array wordlines, a shared source/drain between the gates that is coupled with an array bitline in the fourth layer, and with two ferroelectric cell capacitors in the second layer having bottom electrodes coupled with two outer source/drains in the active region and top electrodes coupled with array platelines in the third layer; and wherein the zero cancellation circuits individually comprise a zero cancellation super cell structure that is substantially identical to at least one memory super cell structure.

25. The ferroelectric memory device of claim 24, wherein the zero cancellation circuits individually comprise a zero cancellation super cell structure that is substantially identical to one memory super cell structure, with one gate being the zero cancellation wordline, with the zero cancellation capacitor in the second layer coupled between the corresponding outer source/drain in the first layer and the zero cancellation plateline in the third layer, and with the shared source drain in the first layer being coupled with the array bitline in the fourth layer.

26. The ferroelectric memory device of claim 24, wherein the zero cancellation circuits individually comprise a zero cancellation super cell structure that is substantially identical to two memory super cell structures.

27. The ferroelectric memory device of claim 26, wherein the zero cancellation circuits individually further comprise a zero cancellation discharge switching device coupled with the zero cancellation capacitor, the zero cancellation discharge switching device selectively coupling the first zero cancellation capacitor terminal to a pre-determined voltage level according to a zero cancellation discharge wordline signal from the control system;

wherein the zero cancellation circuits individually comprise a zero cancellation super cell structure comprising first and second zero cancellation super cells that are substantially identical to memory super cell structures;

wherein the first zero cancellation super cell is substantially identical to the memory super cells and comprises the zero cancellation capacitor and the zero cancellation switching device;

wherein the second zero cancellation super cell is substantially identical to the memory super cells and comprises the zero cancellation discharge switching device;

wherein a shared source/drain of the second zero cancellation super cell is coupled with the pre-determined voltage level and is not connected to a bitline;

wherein the active regions of the first and second zero cancellation super cells are coupled together and coupled with the first zero cancellation capacitor terminal; and wherein one of the first and second zero cancellation super cells is modified such that only the zero cancellation capacitor is coupled between the zero cancellation plateline and the zero cancellation switching device.

28. The ferroelectric memory device of claim 24, wherein the zero cancellation circuits individually further comprise a zero cancellation discharge switching device coupled with the zero cancellation capacitor, the zero cancellation discharge switching device selectively coupling the first zero cancellation capacitor terminal to a pre-determined voltage level according to a zero cancellation discharge wordline signal from the control system; and wherein the zero cancellation circuits individually comprise a zero cancellation super cell structure that is substantially identical to one memory super cell structure with a shifted active region that is shifted by one row position compared with the relative positioning of active regions in the memory super cell structures.

29. The ferroelectric memory device of claim 28, wherein the zero cancellation circuits individually comprise two transistors with a first gate coupled with the zero cancellation wordline, a second gate coupled with the zero cancellation discharge wordline signal, a shared source/drain between the first and second gates, and two outer source/drains in the shifted active region;

wherein the zero cancellation capacitor is provided in the second layer above the shared source/drain of the shifted active region and is coupled between the shared source/drain and a zero cancellation plateline; and wherein one outer source/drain of the shifted active region is coupled to an array bitline in the fourth layer, and the other outer source/drain of the shifted active region is coupled to the pre-determined voltage level in the third layer.

* * * * *